US006718626B2

(12) United States Patent
Kawada

(10) Patent No.: US 6,718,626 B2
(45) Date of Patent: Apr. 13, 2004

(54) APPARATUS FOR DETECTING POSITIONING ERROR OF A COMPONENT WITH RESPECT TO A SUCTION NOZZLE

(75) Inventor: Tosuke Kawada, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 67 days.

(21) Appl. No.: 09/947,363

(22) Filed: Sep. 7, 2001

(65) Prior Publication Data

US 2002/0035783 A1 Mar. 28, 2002

(30) Foreign Application Priority Data

Sep. 13, 2000 (JP) ........................... 2000-277902
Dec. 11, 2000 (JP) ........................... 2000-376153

(51) Int. Cl.[7] ................................................ H05K 3/30
(52) U.S. Cl. ........................ 29/740; 29/743; 29/739; 29/721; 29/DIG. 44; 29/712; 29/833
(58) Field of Search ................ 29/740, 743, 721, 29/DIG. 44, 759, 832, 833, 712; 294/64.1; 901/47

(56) References Cited

U.S. PATENT DOCUMENTS

| 5,541,834 | A | | 7/1996 | Tomigashi et al. |
| 5,667,129 | A | | 9/1997 | Morita et al. |
| 5,878,484 | A | | 3/1999 | Araya et al. |
| 5,911,456 | A | | 6/1999 | Tsubouchi et al. |
| 6,076,394 | A | * | 6/2000 | Tsuda et al. .................. 29/740 |
| 6,286,202 | B1 | * | 9/2001 | Asai et al. .................... 29/740 |
| 6,343,415 | B1 | * | 2/2002 | Okuda et al. ................. 29/740 |
| 2002/0071601 | A1 | * | 6/2002 | Kawada ...................... 382/145 |
| 2002/0108239 | A1 | * | 8/2002 | Isogai et al. .................. 29/834 |

FOREIGN PATENT DOCUMENTS

| EP | 0 416 878 A1 | 3/1991 |
| JP | A 4-344411 | 12/1992 |
| JP | A 11-40996 | 2/1999 |
| JP | 2002-185198 | * 6/2002 |

* cited by examiner

Primary Examiner—Carl J. Arbes
Assistant Examiner—Minh Trinh
(74) Attorney, Agent, or Firm—Oliff & Berridge, PLC

(57) ABSTRACT

An apparatus for detecting a positioning error of an electric component with respect to a suction nozzle by which the electric component is held by suction under a negative pressure, wherein image data representative of images of the suction nozzle and a dog disposed near the suction nozzle are processed to obtain a relative position between the suction nozzle and the dog, a second image-taking step of taking an image of the electric component held by the suction nozzle and an image of the dog, and the positioning error of the electric component with respect to the suction nozzle is obtained on the basis of image data representative of images of the electric component and the dog, and the obtained relative position between the suction nozzle and the dog. Also disclosed is a method and apparatus for mounting the electric component on a circuit substrate, on the basis of the obtained positioning error of the electric component.

6 Claims, 17 Drawing Sheets

APPARATUS FOR DETECTING POSITIONING ERROR OF A COMPONENT WITH RESPECT TO A SUCTION NOZZLE

CROSS REFERENCE TO RELATED APPLICATIONS

This application is related to co-pending application Ser. Nos. 09/941,679 and 09/948,583.

BACKGROUND OF THE INVENTION

1. Field of the Invention

The present invention relates to an electric-component mounting system arranged to mount electric components (including electronic components) on a circuit substrate such as a printed-wiring board, a method of obtaining relative positions of specific sections of the electric-component mounting system which influence the accuracy of mounting of the electric components, and a method and an apparatus of obtaining a positioning error of each electric component as held by a suction nozzle.

2. Discussion of Related Art

Electric-component mounting systems often use a suction nozzle arranged to hold an electric component by suction under a negative pressure. Usually, the actual position of the electric component held by the suction nozzle deviates from the nominal position. In view of this positional deviation of the electric component, it has been practiced to detect an error of positioning of the electric component with respect to the suction nozzle by operating an image-taking device to take an image of the electric component as held by the suction nozzle, and compensate the position of the electric component for the detected positioning error before the electric component is mounted on the circuit substrate. The positioning error includes at least one of an error of positioning of the center position or other reference position of the electric component in a plane perpendicular to an axis of rotation of the suction nozzle, and an error of angular positioning of the electric component about the axis of rotation of the suction nozzle. The circuit substrate on which the electric components are mounted is usually also positioned by a substrate supporting device. However, the actual positions of pads in a circuit pattern formed on the circuit substrate, on which the electric components are to be mounted, more or less deviate from the nominal positions. In view of this deviation, it is practiced to form a fiducial mark on the circuit substrate upon formation of the circuit pattern, detect the positioning error of the circuit substrate by operating an image-taking device to take an image of the fiducial mark, estimate the positional deviation of the pads on the basis of the detected positioning error, and compensate the position of each electric component for the estimated positional deviation before the electric component is mounted on the corresponding pad.

To obtain the positioning error of the electric component with respect to the suction nozzle and the positioning error of the fiducial mark on the circuit substrate with respect to the substrate supporting device, it is necessary to know the positions of the electric component and the fiducial mark relative to the suction nozzle and the image-taking devices when the images of the electric component and the fiducial mark are taken by the image-taking devices. The positioning errors of the electric component and the fiducial mark may be obtained by detecting those relative positions using exclusively designed detecting devices, when the electric-component mounting system is assembled or inspected for maintenance purpose. In this case, the obtained positioning errors are used on an assumption that the detected relative positions are maintained in operation of the system. To obtain the positioning errors in this manner, the detecting devices are required to be complicated and tend to be expensive. Further, ballscrews used in relative-movement devices provided to move the suction nozzle, substrate supporting device and image-taking devices relative to each other undergo elongation and contraction due to a change in the temperature, and elastic deformation due to loads acting thereon. In addition, the machine frame of the electric-component mounting system, brackets which hold the image-taking devices, and other portions of the system are also subject to deformation due to a temperature variation. Accordingly, the actual relative positions of the suction nozzle, substrate supporting device and image-taking devices may vary with respect to the detected relative positions, due to the elongation and contraction and elastic deformation of the ballscrews of the relative-movement devices, and deformation of the machine frame and brackets. The above-indicated elongation and contraction and deformation due to the temperature variation will be collectively referred to as "thermal deformation".

It is further noted that the relative positions of the suction nozzle, substrate supporting device and image-taking devices may vary due to chronological changes of the individual elements of the electric-component mounting system, wearing of the elements during use, and displacements of the elements due to loosening of fastening or fixing devices used in the system. To reduce this variation of the relative positions in an electric-component mounting system which is required to assure a high degree of component mounting accuracy, it has been practiced to provide the system with linear encoders to detect the actual relative positions of the suction nozzle, substrate supporting device and image-taking devices, and/or form the brackets for supporting the image-taking devices, of highly rigid materials having a relatively low coefficient of thermal expansion, and/or design the lenses of the image-taking devices such that the lenses are highly resistant to vibrations. However, such measures inevitably result in an increase in the cost of manufacture of the electric-component mounting system, and cannot therefore be said to be completely satisfactory.

SUMMARY OF THE INVENTION

The present invention was made in view of the problems encountered in the prior art described above. It is therefore an object of the present invention to make it possible to accurately detect the error of positioning of the electric component with respect to the suction nozzle while minimizing an increase of the cost of manufacture of the electric-component mounting system, to improve the component mounting accuracy of the system, or to obtain the relative positions of those sections of the system which influence the component mounting accuracy.

The above object may be achieved according to any one of the following modes of the present invention in the form of a method of and an apparatus for detecting the positioning error of an electric component to be mounted by an electric-component mounting system, a recording medium storing a control program for practicing the method of detecting the positioning error, a method of and an apparatus for obtaining the relative positions of selected sections of the electric-component mounting system, a recording medium storing a control program for practicing the method of obtaining the relative positions, a method of and a system of mounting an electric component on a circuit substrate, and a recording medium storing a control program for practicing the method of mounting the electric component. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A method of detecting a positioning error of an electric component with respect to a suction nozzle by which the electric component is held by suction under a negative pressure, comprising:

a first image-taking step of concurrently taking an image of the suction nozzle and an image of at least one dog disposed in the vicinity of the suction nozzle;

a first data processing step of processing image data representative of the images of the suction nozzle and the at least one dog which have been taken in the first image-taking step, and obtaining and storing a relative position between the suction nozzle and the at least one dog;

a second image-taking step of taking an image of the electric component held by the suction nozzle and an image of the at least one dog; and a second data processing step of obtaining the positioning error of the electric component with respect to the suction nozzle, on the basis of image data representative of the images of the electric component and the at least one dog which have been taken in the second image-taking step, and the relative position between the suction nozzle and the at least one dog obtained in the first data processing step.

The positioning error of the electric component with respect to the suction nozzle includes a center position error of the center position or other reference position of the electric component in a plane perpendicular to a centerline of the suction nozzle, and an angular positioning error of the electric component about the centerline (axis of rotation) of the suction nozzle.

In the second data processing step, the position of the at least one dog is first obtained, and the position of the suction nozzle is obtained on the basis of the obtained position of the at least one dog, and the relative position between the at least one dog and the suction nozzle obtained in the first data processing step, so that the position (positioning error) of the electric component with respect to the thus obtained position of the suction nozzle is obtained. Alternatively, the relative position between the at least one dog and the electric component is first obtained, and the positioning error of the electric component with respect to the suction nozzle is obtained on the basis of the obtained relative position of the at least one dog and the electric component, and the relative position between the at least one dog and the suction nozzle obtained in the first data processing step.

An image-taking device used to take images of the suction nozzle, at least one dog and electric component may consist of only a camera such as a CCD camera, or both a camera, and a suitable waveguide device which includes at least one light reflecting surface or a multiplicity of optical fibers, for guiding a light along a suitable path, to be incident upon the camera. In the former case, the camera is oriented so as to be opposed to the end face of the suction nozzle. In the latter case, the waveguide device is arranged such that the light is incident upon the camera.

In the method according to the above mode (1) of the present invention, the relative position between the at least one dog and the suction nozzle is detected before the electric component is held by the suction nozzle, and then the relative position between the electric component and the at least one dog is obtained, since the image of the electric component held by the suction nozzle cannot be taken in the presence of the suction nozzle hiding the electric component. Thus, the position of the suction nozzle can be accurately estimated on the basis of the detected position of the at least one dog and the detected relative position between the at least one dog and the suction nozzle. The deviation of the electric component with respect to the estimated position of the suction nozzle can be considered to be the actual positioning error of the electric component with respect to the suction nozzle, as long as the relative position between the suction nozzle and the at least one dog remains unchanged. For instance, the at least one dog is supported by a support member holding the suction nozzle, or by a structure which holds the support member such that the support member is rotatable or axially movable relative to the structure. In this instance, it is comparatively easy to substantially prevent a change in the relative position between the suction nozzle and the at least one dog, which would take place due to thermal deformation, elastic deformation, chronological change and wear of those support member or structure. Accordingly, the positioning error of the electric component with respect to the position of the suction nozzle as estimated on the basis of the position of the at least one dog can be considered to be the actual positioning error of the electric component with respect to the actual position of the suction nozzle, so that the actual position of the electric component relative to the suction nozzle is compensated for the thus detected positioning error of the electric component, as well as for an error in the relative position between the suction nozzle and the image-taking device, which error would take place due to the above-indicated reasons such as the thermal and elastic deformation. Therefore, the present method permits mounting of the electric component on a circuit substrate with a high degree of positioning accuracy.

(2) A method according to the above mode (1), wherein the first image-taking step comprises a step of rotating the suction nozzle at least once and taking images of an end face of the suction nozzle placed in at least two angular positions thereof, and the first data processing step comprises a step of obtaining an axis of rotation of the suction nozzle on the basis of the images of the end face of the suction nozzle in the at least two angular positions.

For instance, the suction nozzle is rotated by 180°, and the two images of the end face of the suction nozzle are taken before and after the 180° rotation of the suction nozzle. In this case, the coordinate values of the axis of rotation of the suction nozzle are obtained by averaging the coordinate values of the center position of the end face of the suction nozzle as obtained from the two images. Alternatively, the suction nozzle is rotated three times in angular increment of 90°, so that four images of the end face of the suction nozzle placed in the four angular positions of 0°, 90°, 180° and 270° are taken. In this case, the coordinate values of the rotation axis of the suction nozzle are obtained by averaging the coordinate values of the center position of the end face of the suction nozzle as obtained from the four images. Where the images of the end face of the suction nozzle in at least three angular positions are taken, these angular positions need not be equiangularly spaced from each other. The axis of rotation of the suction nozzle is obtained as the center of a circle on which the center positions of the end face of the suction nozzle in the obtained images lie on the circle.

Where the suction nozzle is not rotatable, the position of the end face of the suction nozzle can be regarded as the position of the suction nozzle when the electric component is mounted on the circuit substrate. Where the suction nozzle is rotatable to permit the mounting of the electric component on the circuit substrate, at any desired angular position of the electric component, however, the position of the axis of rotation of the suction nozzle must be used as the position of the suction nozzle when the electric component is mounted on the circuit substrate. Otherwise, the accuracy of the position at which the electric component is mounted on the circuit substrate is deteriorated.

(3) A method according to the above mode (1) or (2), wherein the at least one dog consists of a plurality of dogs, and images of the plurality of dogs are taken in the first image-taking step, and an inclination of an imaging area in which the images of the dogs are formed is obtained on the basis of a relative position of the plurality of dogs in the first data processing step.

A dog device consisting of at least one dog may be inclined with respect to the imaging area due to assembling errors and thermal deformation of the image-taking device and a support structure holding the image-taking device. This inclination may be detected where the dog device consists of two or more dogs. For example, the dog device consists of two dogs disposed such that images of the two dogs are formed at two adjacent corners of the imaging area of a first image-taking device, which corners are spaced from each other in a direction exactly parallel to the X-axis or Y-axis direction of the imaging area. In this case, a straight line passing predetermined reference points such as apexes of the two dogs can be used as a reference for detecting the inclination of the first image-taking device (inclination of its imaging area). Alternatively, the angle of inclination of the above-indicated straight line passing the reference points of the two dogs with respect to the X-axis or Y-axis is measured by a suitable device, so that the measured angle of inclination is used as the reference for detecting the inclination of the first image-taking device. Further, the inclination of the straight line passing the reference points can be detected by utilizing the function of the electric-component mounting system, for example, by utilizing a fiducial chip, the first image-taking device and a second image-taking device, as discussed later in the following DESCRIPTION OF THE PREFERRED EMBODIMENTS. The dog device per se may be inclined due to the assembling error and thermal deformation of a support device holding the dog. The method indicated above permits detection of the inclination of the dog device, by utilizing the straight line passing the reference points of the two dogs as the reference for detecting the inclination of the imaging area of the first image-taking device. Further, the use of the fiducial chip permits detection of the inclination of the second image-taking device with respect to the first image-taking device. Although the use of a single dog having a comparatively large size and a shape suitable for detecting its inclination permits detection of the inclination of the imaging area, the comparatively large dog should not be hidden by the electric component held by the suction nozzle, in order to permit the dog to perform the assigned function. In this respect, it is preferable to use a plurality of comparatively small dogs which are disposed so that the images of the dogs are formed at peripheral portions of the imaging area, desirably, at corner portions of the rectangular imaging area.

(4) A method of obtaining relative positions of a plurality of sections of an electric-component mounting system wherein an electric component is held by suction by a suction nozzle under a negative pressure and is mounted on a circuit substrate, the plurality of sections influencing an accuracy of mounting of the electric component on the circuit substrate, comprising:

a first image-taking step of operating a first image-taking device to concurrently take an image of said suction nozzle and an image of at least one dog disposed in the vicinity of said suction nozzle;

a first data processing step of processing image data representative of the images of the suction nozzle and the at least one dog which have been taken in the first image-taking step, and obtaining and storing a relative position between the suction nozzle and the at least one dog;

a second image-taking step of operating the second image-taking device to concurrently take an image of a fiducial chip as held by the suction nozzle and an image of the at least one dog;

a second data processing step of obtaining a positioning error of the fiducial chip with respect to the suction nozzle, on the basis of image data representative of the images of the fiducial chip and the at least one dog, and the relative position between the suction nozzle and the at least one dog obtained in the first data processing step;

a chip-mounting step of moving the suction nozzle and a circuit-substrate support device supporting the circuit substrate, relative to each other, and placing the fiducial chip on a mounting surface which is disposed immovably relative to the circuit-substrate support device;

a third image-taking step of operating a second image-taking device to take an image of the fiducial chip placed on the mounting surface; and a third data processing step of obtaining relative positions among the suction nozzle and the first and second image-taking devices, on the basis of image data representative of the image of the fiducial chip taken in the third image-taking step, and wherein the fiducial chip is placed on the mounting surface in the chip-mounting step after a relative position between the suction nozzle and the circuit-substrate support device is compensated for the positioning error of the fiducial chip with respect to the suction nozzle which has been obtained in the second data processing step, or the relative positions among the suction nozzle, and the first and second image-taking devices are obtained in the third data processing step, on the basis of the positioning error of the fiducial chip obtained in the second data processing step, as well as the image data representative of the image of the fiducial chip taken in the third image-taking step.

In the electric-component mounting system provided with the first image-taking device and the second image-taking device, the positioning error of the electric component with respect to the suction nozzle is generally detected on the basis of image data obtained by the first image-taking device, while the positioning error of the circuit substrate with respect to the circuit-substrate support device is generally detected on the basis of image data obtained by the second image-taking device, so that the relative position between the suction nozzle and the circuit-substrate support device is compensated for the positioning errors of the electric component and the circuit substrate when the electric component is mounted on the circuit substrate according to a component mounting control program. In the presence of errors between the suction nozzle and the first and second image-taking devices, the accuracy of mounting of the electric component on the circuit substrate is deteriorated. According to the present method, the relative positions among the suction nozzle and the first and second image-taking devices, for instance, positioning errors of two of those three elements relative to the other one element are detected are detected, and the relative position between the suction nozzle and the circuit substrate is compensated for the detected positioning errors as well as the positioning errors of the electric component and the circuit-substrate support device, before the electric component is mounted on the circuit substrate, whereby the accuracy of mounting of the electric component on the circuit substrate is improved.

The fiducial chip is a chip designed exclusively for obtaining the relative positions of the suction nozzle and the first and second image-taking devices. Alternatively, one of electric components to be mounted on the circuit substrate is utilized as the fiducial chip. In the former case, the fiducial chip is manufactured so as to have high degrees of geometrical and dimensional accuracy and optical properties suitable for the detection, so that the accuracy of detection of the above-indicated relative positions can be easily improved.

The mounting surface may be provided permanently on a selected component or element of the mounting system, for instance, may be temporarily provided on the circuit substrate on which the electric component is to be mounted. All that is required for the mounting surface is that the mounting surface is immovable or fixed in position relative to the circuit-substrate support device in the chip-mounting step and the third image-taking step.

The method of obtaining the relative positions according to the above mode (4) of the invention may be practiced upon assembling or maintenance inspection of the electronic-component mounting system, or at a suitable point of time during the component mounting operation. In the former case, the component mounting control program is adjusted or changed on the basis of the obtained relative positions, so as to improve the component mounting accuracy of the electric-component mounting system. In the latter case, changes in the relative positions among the appropriate sections of the mounting system due to thermal deformation are obtained, and the relative position between the suction nozzle and the circuit-substrate support device is compensated on the basis of the detected changes, for thereby further improving the component mounting accuracy of the system. The present method assures a sufficiently high degree of component mounting accuracy even where the component mounting operation is initiated before the operating temperatures of the individual sections of the system have become stable.

(5) A method of mounting an electric component on a circuit substrate, comprising:

a method of obtaining relative positions of a plurality of sections of an electric-component mounting system, according to the above mode (4) of this invention;

a fourth image-taking step of operating the second image-taking device to take an image of a fiducial mark provided on the circuit substrate supported by the circuit-substrate support device;

a fourth data processing step of obtaining a positioning error of the circuit substrate on the basis of image data representative of the image of the fiducial mark taken in the fourth image-taking step;

a fifth image-taking step of operating the suction nozzle to hold the electric component, and operating the first image-taking device to take an image of the electric component held by the suction nozzle: and a component-mounting step of compensating the relative position between the circuit-substrate support device and the suction nozzle, on the basis of image data representative of the image of the electric component obtained in the fifth image-taking step, the relative positions among the suction nozzle and the first and second image-taking devices, and the positioning error of the circuit substrate obtained in the fourth data processing step, so that the electric component is mounted at a predetermined position on the circuit substrate.

The positioning error of the circuit substrate (positioning error of the fiducial mark) obtained in the fourth data processing step indicated above may be an error of positioning of the circuit substrate within the imaging area of the second image-taking device (positioning error of the circuit substrate with respect to the second image-taking device), or a deviation of the actual position of the circuit substrate with respect to a nominal position of the circuit substrate. In the former case, the positioning error of the circuit substrate with respect to its nominal position may be represented, for example, by a sum of a positioning error of the circuit substrate with respect to the second image-taking device, and a positioning error of the second image-taking device with respect to the first image-taking device, provided the position of the first image-taking device represents the reference position of the electric-component mounting system as a whole.

(6) A recording medium storing a control program for practicing the method according to any one of the above modes (1)–(3), such that the control program is readable by a computer.

(7) A recording medium storing a control program for practicing the method according to the above mode (4), such that the control program is readable by a computer.

(8) A recording medium storing a control program for practicing the method according to the above mode (5), such that the control program is readable by a computer.

(9) An apparatus for detecting a positioning error of an electric component with respect to a suction nozzle by which the electric component is held by suction under a negative pressure, comprising:

an image-taking device operable to take an image of the suction nozzle in a direction of extension of a centerline of the suction nozzle;

at least one dog each disposed at a position at which an image of the at least one dog can be taken together with an image of the suction nozzle by the image-taking device;

an image-taking control device operable to operate the image-taking device to concurrently take the images of the suction nozzle and the at least one dog, and to concurrently take an image of the electric component as held by the suction nozzle and the image of the at least one dog; and a data processing device operable to obtain a relative position between the suction nozzle and the at least one dog, on the basis of the images of the suction nozzle and the at least one dog which have been concurrently taken, and obtaining the positioning error of the electric component with respect to the suction nozzle, on the basis of the images of the electric component and the at least one dog which have been concurrently taken, and the relative position between the suction nozzle and the at least one dog.

The apparatus according to the above mode (9) of the invention is suitable for practicing the method according to the above mode (1) of detecting the positioning error of the electric component with respect to the suction nozzle.

(10) An apparatus according to the above mode (9), wherein the image-taking control device comprises a plural-imaging control portion operable to rotate the suction nozzle at least once and take images of an end face of the suction nozzle placed in at least two angular positions thereof, and a rotation-axis obtaining portion operable to obtain an axis of rotation of the suction nozzle on the basis of the images of the end face of the suction nozzle in the at least two angular positions.

(11) An apparatus according to the above mode (9) or (10), wherein the at least one dog consists of a plurality of dogs which are located such that images of the plurality of dogs are formed at respective peripheral portions of an imaging area of the image-taking device, when the images of the dogs are taken by the image-taking device, concurrently with the image of the suction nozzle.

(12) An apparatus according to any one of the above modes (9)–(11), wherein the data processing device obtains an inclination of the imaging area of the image-taking device on the basis of the images of the plurality of dogs.

(13) An apparatus according to any one of the above modes (9)–(12), wherein each of the at least one dog has a generally rectangular shape, and includes a sensed portion having an apex which is defined by adjacent two sides of a rectangle of the generally rectangular shape.

The apex defined by the adjacent two sides of the rectangle of the generally rectangular shape of the sensed portion of each dog can be accurately detected, as the reference position of the dog.

(14) An apparatus according to the above mode (13), wherein the sensed portion has two chamfered surfaces formed along the adjacent two sides, so as to provide two sharp edges of an acute angle which intersect each other at right angles at the apex.

Where the a portion of the dog defining the adjacent two sides of the sensed portion have a relatively large thickness, sharp images of the two sides cannot be obtained by the image-taking device. In this respect, the apex is ideally defined by a point of intersection of two sharp edges of an actuate angle which are provided by the two chamfered surfaces so that the thickness at the apex is substantially zero, for accurate detection of the dog. From the standpoint of ease of manufacture, durability and safety of the dog, however, the portion defining the adjacent two sides of the sensed portion may have an extremely small thickness value.

(15) An apparatus for obtaining relative positions of a suction nozzle, a first image-taking device and a second image-taking device, in an electric-component mounting system wherein an electric component is held by suction by the suction nozzle and is mounted on a circuit substrate supported by a circuit-substrate support device, the first image-taking device being operable to take an image of the suction nozzle in a direction of extension of a centerline of the suction nozzle, and the second image-taking device being operable to take an image of a fiducial mark provided on the circuit substrate, the electric-component mounting system further including (a) a component supply device for supplying the suction nozzle with the electric component, (b) a relative-movement device for moving the component supply device, the suction nozzle and the circuit-substrate support device relative to each other, (c) a component-mounting control device for controlling the relative-movement device and the suction nozzle such that the electric component received by the suction nozzle from the component supply device is mounted at a predetermined position on the circuit substrate supported by the circuit-substrate support device, and (d) a data processing device for processing image data representative of the images taken by the first and second image-taking device, the apparatus comprising:

at least one dog located such that an image of each of the at least one dog can be taken by the first image-taking device, together with the image of the suction nozzle;

image-taking control means for controlling the first image-taking device to concurrently take the images of the suction nozzle and the at least one dog, and to concurrently take an image of a fiducial chip held by the suction nozzle and the image of the each dog;

positioning-error obtaining means for obtaining a relative position between the suction nozzle and the at least one dog, on the basis of the images of the suction nozzle and the at least one dog which have been concurrently taken under the control of the image-taking control means, the positioning-error obtaining means obtaining a positioning error of the fiducial chip with respect to the suction nozzle, on the basis of the images of the fiducial chip and the at least one dog which have been concurrently taken, and the relative position between the suction nozzle and the at least one dog;

fiducial-chip mounting control means for moving the suction nozzle and the circuit-substrate support device, and placing the fiducial chip on a mounting surface which is disposed immovably relative to the circuit-substrate support device;

fiducial-chip imaging control means for operating the second image-taking device to take the image of the fiducial chip placed on the mounting surface; and relative-position obtaining means for obtaining relative positions among the suction nozzle and the first and second image-taking devices, on the basis of image data representative of the image of said fiducial chip, and wherein the fiducial-chip mounting control means is operable to compensate a relative position between the suction nozzle and the circuit-substrate support device for the positioning error of the fiducial chip with respect to the suction nozzle before the fiducial chip is placed on the mounting surface, or the relative-position obtaining means is operable to obtain the relative positions among the suction nozzle and the first and second image-taking devices on the basis of the positioning error of the fiducial chip, as well as the image data representative of the image of the fiducial chip taken under the control of the fiducial-chip imaging control means.

The apparatus constructed according to the above mode (15) is suitable for practicing the method of obtaining the relative position according to the above mode (4).

(16) An electric-component mounting system including (a) a component supply device for supplying an electric component, (b) a suction nozzle for holding the electric component by suction, (c) a circuit-substrate support device for supporting a circuit substrate, (d) a relative-movement device for moving the component supply device, the suction nozzle and the circuit-substrate support device, relative to each other, (e) a component-mounting control device for controlling the relative-movement device and the suction nozzle such that the electric component received by the suction nozzle from the component supply device is mounted at a predetermined position on the circuit substrate supported by the circuit-substrate support device, (f) a first image-taking device operable to take an image of the suction nozzle in a direction of extension of a centerline of the suction nozzle, (g) a second image-taking device operable to take an image of a fiducial mark provided on the circuit substrate supported by the circuit-substrate support device, and (h) a data processing device for processing image data representative of the images taken by the first and second image-taking devices, the electric-component mounting system comprising:

at least one dog located such that an image of each of the at least one dog can be taken by the first image-taking device, together with the image of the suction nozzle;

image-taking control means for controlling the first image-taking device to concurrently take the images of the suction nozzle and the at least one dog, and to concurrently take an image of a fiducial chip held by the suction nozzle and the image of the each dog;

positioning-error obtaining means for obtaining a relative position between the suction nozzle and the at least one dog, on the basis of the images of the suction nozzle and the at least one dog which have been concurrently taken under the control of the image-taking control means, the positioning-error obtaining a positioning error of the fiducial chip with respect to the suction nozzle, on the basis of the images of the fiducial chip and the at least one dog which have been concurrently taken, and the relative position between the suction nozzle and the at least one dog;

fiducial-chip mounting control means for moving the suction nozzle and the circuit-substrate support device, and placing the fiducial chip on a mounting surface which is disposed immovably relative to the circuit-substrate support device;

fiducial-chip imaging control means for operating the second image-taking device to take the image of the fiducial chip placed on the mounting surface;

relative-position obtaining means for obtaining relative positions among the suction nozzle and the first and second image-taking devices, on the basis of image data representative of the image of the fiducial chip;

the fiducial-chip mounting control means being operable to compensate a relative position between the suction nozzle and the circuit-substrate support device for the positioning error of the fiducial chip with respect to the suction nozzle before the fiducial chip is placed on the mounting surface, or the relative-position obtaining means being operable to obtain the relative positions among the suction nozzle and the first and second image-taking devices on the basis of the positioning error of the fiducial chip, as well as the image data representative of the image of the fiducial chip taken under the control of the fiducial-chip imaging control means;

fiducial-mark imaging control means for operating the second image-taking device to take an image of the fiducial mark provided on the circuit substrate supported by the circuit-substrate support device;

substrate-positioning-error obtaining means for obtaining a positioning error of the circuit substrate on the basis of image data representative of the image of the fiducial mark taken under the control of the fiducial-mark imaging control means;

electric-component imaging control means for operating the suction nozzle to hold the electric component, and operating the first image-taking device to take an image of the electric component held by the suction nozzle; and mounting control means for compensating the relative position between the circuit-substrate support device and the suction nozzle, on the basis of image data representative of the image of the electric component, the relative positions among the suction nozzle and the first and second image-taking devices, and the positioning error of the circuit substrate obtained by the substrate-positioning-error obtaining means, so that the electric component is mounted at the predetermined position on the circuit substrate.

The electric-component mounting system constructed according to the above mode (16) is suitable for practicing the method according to the above mode (5).

(17) An electric-component mounting system according to the above mode (16), wherein the relative-movement device includes an X-axis slide movable in an X-axis direction in a plane parallel to a surface of the circuit substrate supported by the circuit substrate support device, and a Y-axis slide which is supported by the X-axis slide movably in the plane in a Y-axis direction perpendicular to the X-axis direction and which holds the suction nozzle, and the first image-taking device is fixedly disposed on the X-axis slide.

(18) An electric-component mounting system according to the above mode (16), wherein the relative-movement device includes an X-axis slide movable in an X-axis direction in a plane parallel to a surface of the circuit substrate supported by the circuit substrate support device, and a Y-axis slide which is supported by the X-axis slide movably in the plane in a Y-axis direction perpendicular to the X-axis direction and which holds the suction nozzle, and the first image-taking device is fixed to a stationary member which supports the X-axis slide.

(19) An electric-component mounting system according to any one of the above modes (16)–(18), wherein the relative-movement device includes an X-axis slide movable in an X-axis direction in a plane parallel to a surface of the circuit substrate supported by the circuit substrate support device, and a Y-axis slide which is supported by the X-axis slide movably in the plane in a Y-axis direction perpendicular to the X-axis direction and which holds the suction nozzle, and the second image-taking device is fixedly disposed on the Y-axis slide.

(20) An electric-component mounting system according to any one of the above modes (17)–(19), wherein the mounting surface includes a first mounting surface located at a first position near zero points of the X-axis slide and the Y-axis slide, and a second mounting surface located at a second position remote from the zero points of the X-axis slide and the Y-axis slide, and the fiducial-chip mounting control means is operable to place the fiducial chip on both of the first and second mounting surfaces.

(21) An electric-component mounting system according to the above mode (16), wherein the relative-movement device includes an angular positioning device operable to turn the suction nozzle about a turning axis such that the suction nozzle is stopped at a plurality of working stations arranged along a path of turning of the suction nozzle, and an XY positioning device operable to move the circuit-substrate support device in mutually perpendicular X-axis and Y-axis directions in a plane parallel to a surface of the circuit substrate supported by the circuit-substrate support device, and the first image-taking device is fixedly disposed so as to be opposed to an end face of the suction nozzle stopped at one of the plurality working stations, while the second image-taking device is fixedly disposed so as to be opposed to the circuit substrate supported on the circuit-substrate support device.

(22) An electric-component mounting system according to the above mode (21), wherein the XY positioning device includes an X-axis slide movable in the X-axis direction, and a Y-axis slide movable in the Y-axis direction, and the mounting surface includes a first mounting surface located at a first position near zero points of the X-axis slide and the Y-axis slide, and a second mounting surface located at a second position remote from the zero points of the X-axis slide and the Y-axis slide, and the fiducial-chip mounting control means is operable to place the fiducial chip on both of the first and second mounting surfaces.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
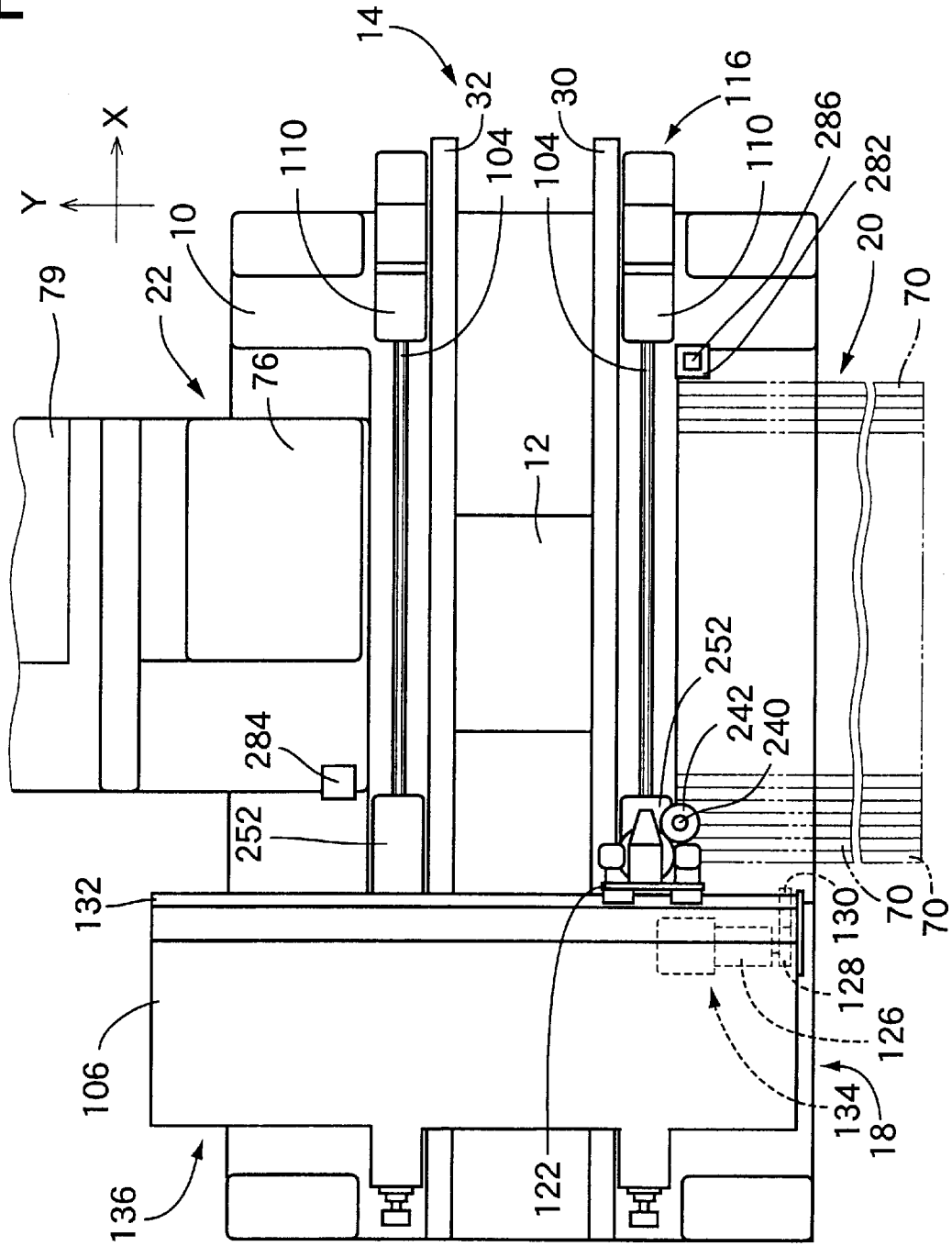
FIG. 1 is a plan view showing an electronic-component mounting system constructed according to one embodiment of this invention.
Figure 2:
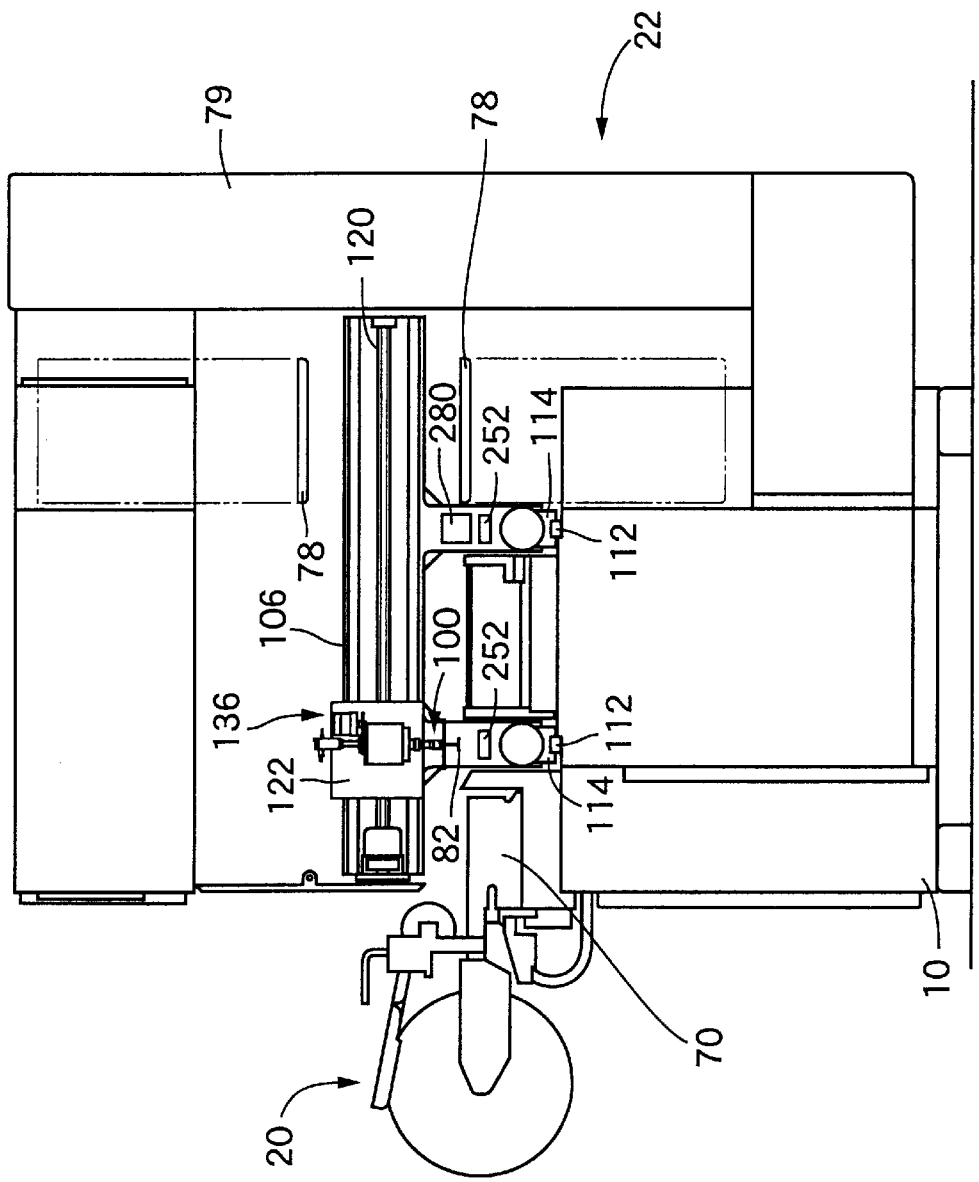
FIG. 2 is a side elevational view of the electronic-component mounting system of FIG. 1.

Referring first to FIGS. 1 and 2, reference numeral 10 denotes a machine base of an electronic-component mounting system. The electronic-component mounting system includes a printed-wiring board conveyor (PWB conveyor) 14, a component mounting device 18 and component supply devices 20, 22, which are mounted on the machine base 10. The PWB conveyor 14 is arranged to transfer a circuit substrate in the form of a printed-wiring board 12 in an X-axis direction (in the left and right directions as seen in FIG. 1). The component mounting device 18 is arranged to mount electric components in the form of electronic components on the printed-wiring board 12. The component supply devices 20, 22 are arranged to supply the component mounting device 18 with the electronic components.

In the present embodiment, the printed-wiring board 12 is transferred by the PWB conveyor 14 such that the printed-wiring board 12 maintains a horizontal attitude or posture. The PWB conveyor 14 is stopped by a suitable stopper device (not shown), to locate the board 12 at a predetermined component-mounting position. The board 12 located at the component-mounting position is supported by a circuit-board support device in the form of a printed-wiring board support device 26 which will be described by reference to FIG. 5. In the present electronic-component mounting system, the printed-wiring board 12 is supported such that a component-mounting surface 28 of the board 12 on which the electronic components are mounted is parallel to the horizontal plane. The above-indicated X-axis direction in which the board 12 is transferred by the PWB conveyor 14 is parallel to an X axis of an XY coordinate system in an XY plane parallel to the horizontal component-mounting surface 28.

Figure 5:
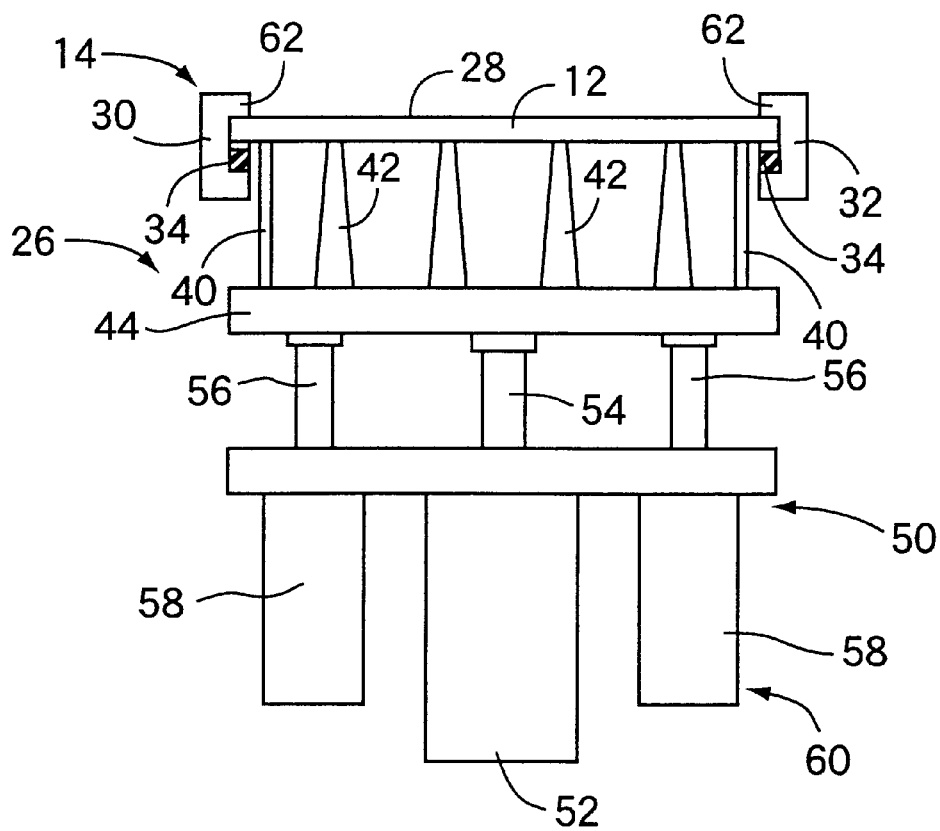
FIG. 5 is a side elevational view schematically showing a printed-wiring board support device of the electronic-component mounting system.

The printed-wiring board conveyor or PWB conveyor 14 is provided with a pair of guide rails 30, 32, as schematically shown in FIGS. 1 and 5. One of the guide rails 30, 32 is a stationary guide rail fixed on the machine base 10, while the other guide rail is a movable guide rail which is movable toward and away from the stationary guide rail, to change a distance between the stationary and movable guide rails, depending upon the width of the PWB conveyor 14, which is a dimension as measured in a Y-axis direction perpendicular to the X-axis direction in which the PWB conveyor 14 is transferred.

Each of the two guide rails 30, 32 is constructed to guide an endless conveyor belt 34 such that the belt 34 can travel in a hoop. The printed-wiring board 12 is placed on the conveyor belts 34, and is transferred by the conveyor belts 34 when the conveyor belts 34 are rotated in synchronization with each other by a drive source in the form of a printed-wiring board feed motor (PWB feed motor) 36 indicated in the block diagram of FIG. 9.

As schematically shown in FIG. 5, the printed-wiring board support device 26 includes a pair of clamping members 40 and a plurality of supporting members 42. Each of the clamping members 40 takes the form of a plate fixed upright at a corresponding one of opposite ends of an elevator platform 44 such that the two clamping members 40 extend in the X-axis direction, namely, in the direction of movement of the board 12. The plurality of supporting member 42 are fixed upright in an intermediate width portion of the elevator platform 44 which is located intermediate between the two clamping members 40. The elevator platform 44 is located under the printed-wiring board 12 at the predetermined component-mounting position, such that the elevator platform 44 is opposed to the lower surface of the board 12 which is opposite to the component-mounting surface 28 on which the electronic components are mounted by the present electronic-component mounting system.

The elevator platform 44 is lifted and lowered by an elevator drive device 50, which includes a drive source in the form of a fluid-operated actuator such as a fluid-operated cylinder. In the specific example of FIG. 5, the elevator drive device 50 uses, as the drive source, an elevator cylinder 52 which is a pneumatic cylinder. The elevator cylinder 52 is disposed so as to extend in the vertical direction, and includes a piston rod 54 for engagement with the elevator platform 44. The printed-wiring board support device 26 further includes a guiding device 60, which includes two or more sets of guide rods 56 and guide sleeves 58. The guide rod 56 of each set is fixed to the elevator platform 44 and is guided by the corresponding guide sleeve 58. When the piston rod 54 of the elevator cylinder 52 is moved up and down, the elevator platform 44 is lifted and lowered by the piston rod 54 while the elevator platform 44 is guided by the guiding device 60, so that the clamping members 40 and the supporting members 42 are moved perpendicularly to the component-mounting surface 28 of the printed-wiring board 12, in opposite directions toward and away from the board 12. When the elevator platform 44 is placed at its elevated operating position, the clamping members 40 hold the board 12 apart from the upper surfaces of the conveyor belts 34 such that the board 12 is clamped at its opposite ends corresponding to the conveyor belts 34, in pressing contact with the upper ends of the clamping members 40 and hold-down portions 62 provided in the guide rails 30 32, and such that the supporting members 42 support the board 12, with their upper ends held in contact with the lower surface of the board 12.

The component supply devices 20, 22 are spaced from each other in a Y-axis direction perpendicular to the X-axis direction, and located on the opposite sides of the PWB conveyor 14, as shown in FIGS. 1 and 2. In the present embodiment, the component supply device 20 is of tape feeder type, while the component supply device 22 is of tray type. The component supply device 20 of tape feeder type includes a multiplicity tape feeders 70 which are arranged in the X-axis direction. Each tape feeder 70 has a tape cartridge arranged to feed a carrier tape which accommodates electronic components. The carrier tape includes a carrier substrate which has a multiplicity of component-accommodating recesses formed at a suitable interval along the length of the carrier tape. The electronic components are accommodated in the respective component-accommodating recesses. The opening of each component-accommodating recess is closed by a covering film bonded to the carrier substrate, to prevent the electronic components from moving out of the recesses when the carrier tape is fed. In operation of each tape feeder 70, the carrier tape is fed from the tape cartridge, with a predetermined pitch in the Y-axis direction, while the covering film is separated from a length portion of the carrier substrate which has been fed from the tape cartridge. Thus, the electronic components are fed one after another to a predetermined component-supply position. The electronic components accommodated in the tape feeders 70 include electronic components having leads, and electronic components not having leads. Since the electronic components of either kind are substantially accurately positioned within the respective component-accommodating recesses, each electronic component fed to the predetermined component-supply position can be held at an almost central portion thereof by the component mounting device 18, and can be taken out of the recess, while the electronic component almost maintains predetermined attitude and position relative to the component mounting device 18.

The component supply device 22 of tray type includes a multiplicity of component trays 76 (FIGS. 1 and 3) accommodating electronic components. The component trays 76 are accommodated in respective multiple tray boxes 78, which are vertically arranged and are supported by respective support members. The tray boxes 78 are elevated one after another by an elevator device disposed within a column 79 (FIG. 1), to a predetermined component-supply position. For a component holding device 100 (which will be described) of the component mounting device 18 to receive the electronic components from the component tray 76 in the tray box 78 located at the component-supply position, some vertical space must be provided above the component-supply position. To provide this vertical space, the tray box 78 from which the electronic components have been transferred to the component holding device 100 is moved further upwards from the component-supply position to a predetermined retracted position when the next tray box 78 is moved to the component-supply position, so that the required vertical space is provided between the component-supply position and the retracted position. The component supply device 22 of tray type is identical in construction to a component supply device disclosed in JP-B2-2-57719.

Figure 6:
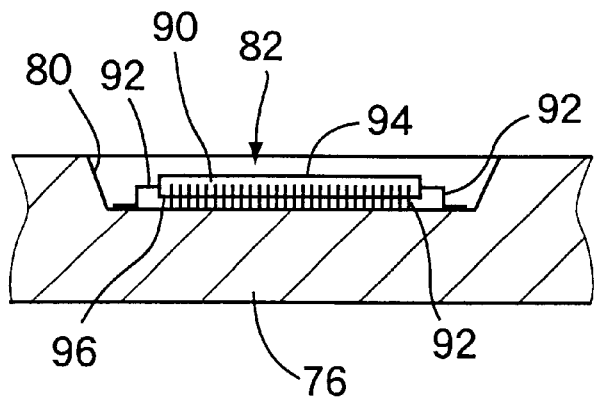
FIG. 6 is a side elevational view showing an electronic component accommodated in a component tray in the electronic-component mounting system.

Thus, the component mounting device 18 receives the electronic components one after another from the component tray 76 in the tray boxy 78 at the component-supply position above which the required vertical space is provided. Each component tray 76 accommodates the electronic components 82 in component accommodating recesses 80 (FIG. 6) which are arranged in a matrix. Each electronic component 82 accommodated in the corresponding recess 80 is substantially positioned, so that the electronic component 82 can be held at an almost central portion thereof by the component mounting device 18, and can be taken out of the recess 80, while the electronic component almost maintains predetermined attitude and position relative to the component mounting device 18. In the specific example of FIG. 6, the electronic component 82 has a multiplicity of leads 92 extending from the four side faces of a rectangular body 90. The electronic component 82 is mounted at its bottom surface 96 on the printed-wiring board 12 so that the leads 92 are connected to the printed wiring of the board 12. The electronic component 82 has a top surface 94 opposite to the bottom surface 96. The electronic component 82 may be provided with a ball-grid array, or may not have the leads 92.

Figure 4:
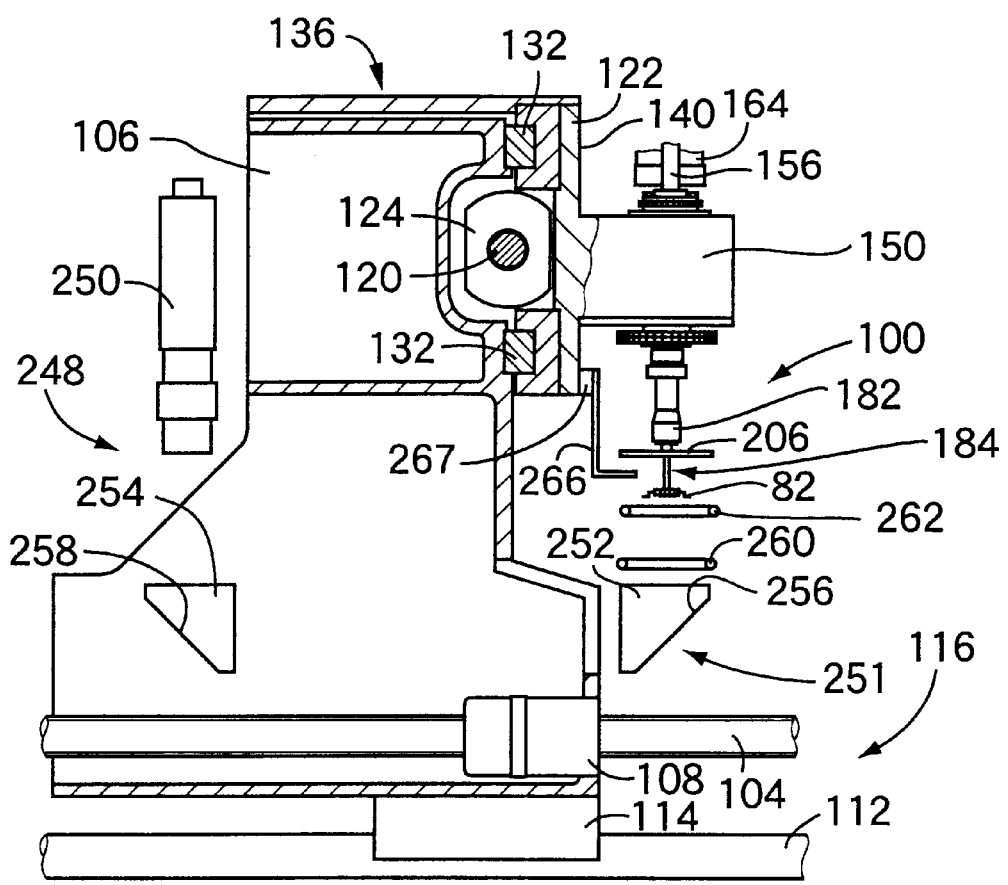
FIG. 4 is a side elevational view partly in cross section of the electronic-component mounting system.

The component holding device 100 of the component mounting device 18 is movable in the mutually perpendicular X-axis and Y-axis directions, so that the component holding device 100 can take a linear movement having X-axis and Y-axis components, to move each electronic component 82 to a desired position on or above the component-mounting surface 28 of the printed-wiring board 12. To move the component holding device 100 in the X-axis direction, the component mounting device 18 includes two ballscrews 104 disposed on the machine base 10, on the opposite sides of the PWB conveyor 14, so as to extend in the X-axis direction, as shown in FIG. 1, and an X-axis slide 106 having two ballnuts 108 (only one of which is shown in FIG. 4) which engage the respective ballscrews 104. The device 18 further includes two X-axis drive motors 110 for rotating the ballscrews 104, for moving the X-axis slide 106 in the X-axis direction. As shown in FIG. 2, the X-axis slide 106 extends in the Y-axis direction across the PWB conveyor 14, and has a length corresponding to the distance between the component supply device 20 of feeder type and the component supply device 22 of tray type. On the machine base 10, there are disposed two guide rails 112 located under the respective ballscrews 104. The X-axis slide 106 has two guide blocks 114 which slidably engage the guide rails 112, for guiding the X-axis slide 106 in the X-axis direction. It will be understood that the ballscrews 104, ballnuts 108 and X-axis drive motors 110 cooperate with each other to constitute an X-axis drive device 116.

On the X-axis slide 106, there is disposed a ballscrew 120 so as to extend in the Y-axis direction, as shown in FIG. 4. The X-axis slide 106 carries a Y-axis slide 122 having a ballnut 124 which engages the ballscrew 120. The ballscrew 120 is rotated by a Y-axis drive motor 126 (FIG. 1) through gears 128, 130, so that the Y-axis slide 122 is moved in the Y-axis direction while being guided by a pair of guide rails 132 (FIG. 4). It will be understood that the ballscrew 120, ballnut 124 and Y-axis drive motor 124 constitute a Y-axis drive device 134, and that the Y-axis drive device 134 cooperates with the X-axis slide 106, X-axis drive device 116 and Y-axis slide 122, to constitute an XY positioning device 136 for moving the component holding device 100 to a desired position in the XY plane.

The Y-axis slide 122 has an upright side surface 140 on which there are mounted the above-indicated component holding device 100, a Z-axis drive device 144 for moving up and down the component holding device 100 in a Z-axis direction, and a rotary drive device 146 for rotating the component holding device 100 about its axis. The component holding device 100, the Z-axis drive device 144 and the rotary drive device 146 constitute a component mounting unit. Although the component mounting device 18 in the present electronic-component mounting system includes only one component mounting unit, the electronic-component mounting system may include a plurality of component mounting units. For instance, the two or more component mounting units are disposed on the Y-axis slide 122 such that the units are arranged in a row in the Y-axis direction.

Figure 7:
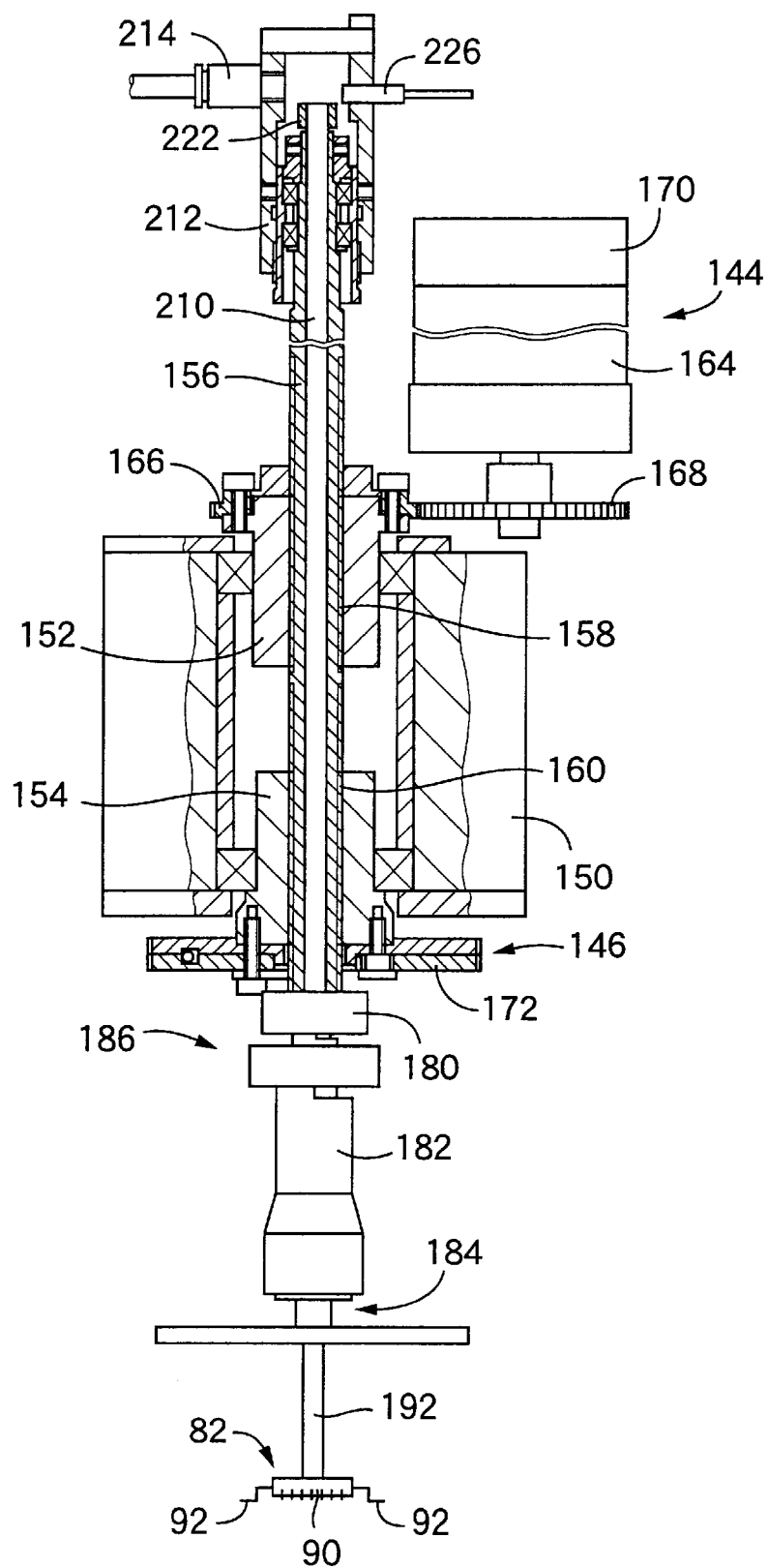
FIG. 7 is a side elevational view partly in cross section showing a component mounting unit of the component mounting device of FIG. 3.

The component mounting unit in the present embodiment is identical with a component mounting unit as disclosed in JP-B2-4-3093339. The component mounting unit will be described only briefly. The Y-axis slide 122 carries a support portion 150 mounted on the side surface 140. As shown in FIG. 7, the support portion 150 supports a nut 152 and a splined member 154 such that the nut 152 and splined member 154 are coaxial with each other, spaced apart from each other in the axial direction, and rotatable about their axis of rotation extending in the vertical or Z-axis direction. The nut 152 engages an externally threaded portion 158 of a hollow rod 156 while the splined member 154 engages a splined portion 160 of the hollow rod 156. The splined portion 160 is formed below the externally threaded portion 158. The nut 152 and splined member 154 are ballnut and ball-splined member which hold a multiplicity of balls.

The nut 152 is rotated by a rotary drive device including a Z-axis drive motor 164 and gears 166, 168, so that the hollow rod 156 is axially moved, that is, lifted and lowered. Thus, the nut 152, gears 166, 168 and Z-axis drive motor 164 constitute the Z-axis drive device 144. The Z-axis drive device 144 arranged to move the hollow rod 156 in the axial direction functions to move the component holding device 100 in the axial direction, that is, in the Z-axis direction perpendicular to the component-mounting surface 28 of the printed-wiring board 12, so that the component holding device 100 is moved toward and away from the printed-wiring board 12. The amount of operation of the Z-axis drive motor 164 is detected by a rotary encoder 170.

Figure 9:
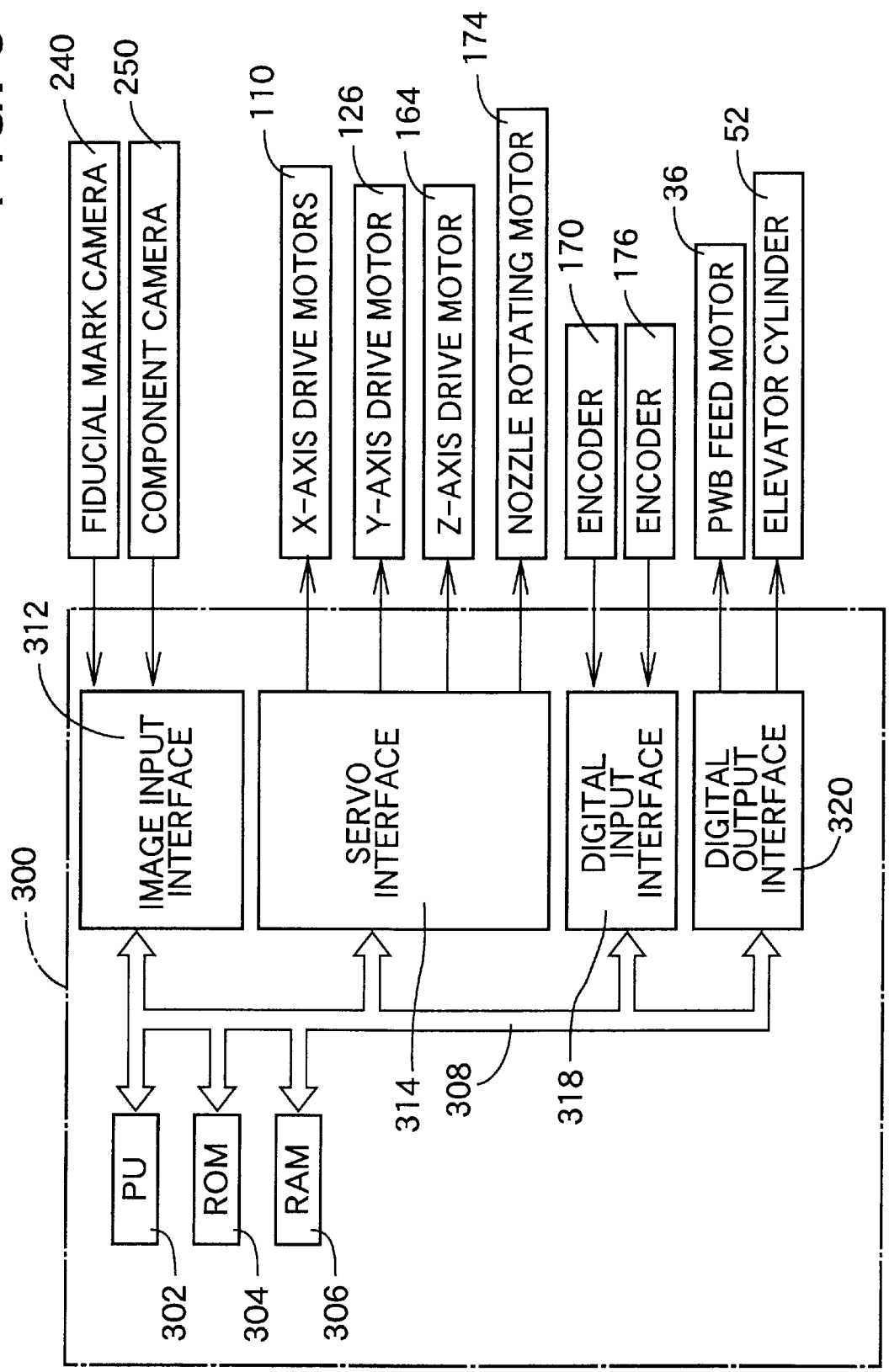
FIG. 9 is a lock diagram schematically illustrating a control device of the electronic-component mounting system.

To the lower end portion of the splined member 154 which projects from the support portion 150, there is fixed a gear 172 which meshes with a gear fixed to the output shaft of a nozzle rotating motor 174 (FIG. 9). The hollow rod 156 is rotated about its axis when the splined member 154 is rotated by the nozzle rotating motor 174. Thus, the component holding device 100 is rotatable about its axis so that the electric component 82 held by the component holding device 100 can be rotated about an axis which extends in the vertical direction perpendicular to the top surface 94 of the electronic component 82, through an almost central part of the top surface 94.

Figure 8:
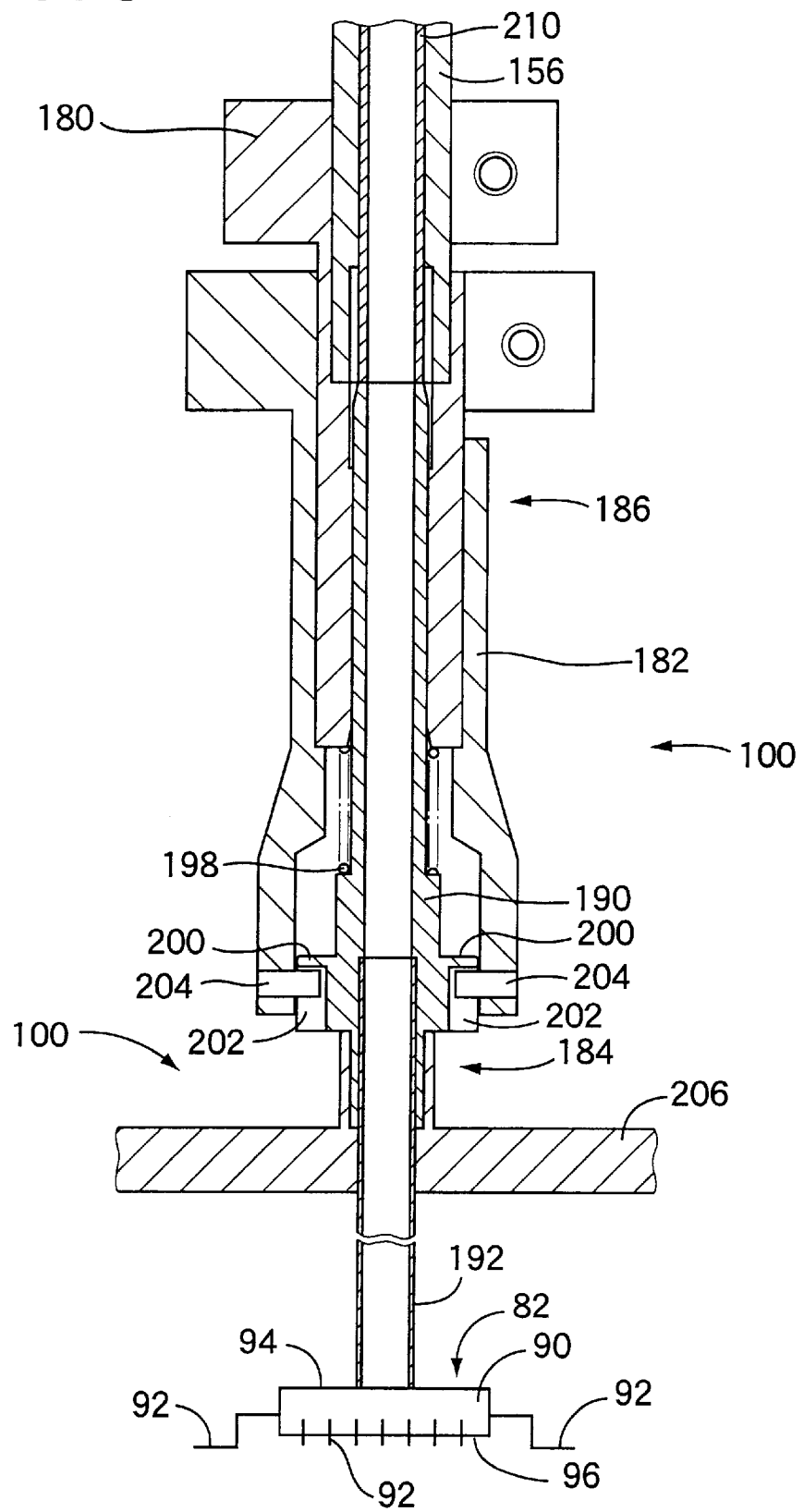
FIG. 8 is a side elevational view in cross section showing a component holding device of the component mounting unit of FIG. 7.

On the lower end portion of the hollow rod 156, there is removably mounted a chuck adapter 180 on which a chuck 182 is removably mounted, as shown in FIG. 8. The hollow rod 156, chuck adapter 180 and chuck 182 constitute a nozzle holder 186 for removably holding a suction nozzle 184. The nozzle holder 186 and the suction nozzle 184 constitute the component holding device 100.

The suction nozzle 184 has a sleeve 190 and a suction pipe 192 which is partially fitted in the sleeve 190. The sleeve 190 is fitted at its upper portion in the chuck adapter 180 such that the sleeve 190 is biased by a compression coil spring 198 (hereinafter referred to simply as "spring 198") in a direction that causes an exposed lower portion of the sleeve 190 to be moved away from the lower end of the chuck adapter 180. The spring 198 is interposed between the exposed lower portion of the sleeve 190 and the lower end of the chuck adapter 180. The exposed lower portion of the sleeve 190 has a pair of radially extending lugs 200, which are opposed to each other in a diametric direction of the sleeve 190 and which has a pair of slant surfaces 202 lying in the same plane. The chuck 182 has a pair of pins 204 which engage the respective slang surfaces 202, so that the suction nozzle 184 is held by the chuck 182 such that the suction nozzle 184 is not axially movable and not rotatable relative to the chuck 180. The spring 198 serves as biasing means in the form of an elastic member.

A light emitting plate 206 is fixedly mounted on the outer circumferential surface of the lower end portion of the sleeve 190 which is located outside the chuck 182, while the suction nozzle 192 is partially fitted in the inner circumferential surface of the lower end portion of the sleeve 190, such that the suction nozzle 192 extends downwards through the light emitting plate 206. When the position of the electronic component 82 held by the suction nozzle 184 is detected, the light emitting plate 206 receives a ultraviolet radiation, and generates a visible light toward the electronic component 82.

The suction nozzle 184 is arranged to hold the electronic component 82 by suction under a negative pressure, when the electronic component 82 is mounted on the printed-wiring board 12. To this end, the suction nozzle 184 is connected to a negative pressure source, a positive pressure source and the atmosphere, through: a pipe 210 which is axially movably fitted in the hollow rod 156, as shown in FIG. 7; a housing 212 fixed to the upper end portion of the pipe 210 which extends from the hollow rod 156, as also shown in FIG. 7; a nipple 214 attached to the housing 212; and a solenoid-operated directional control valve (not shown). With a switching action of the solenoid-operated directional control valve, the suction pipe 192 is selectively communicated with one of the negative pressure source, positive pressure source and atmosphere. When a negative pressure is applied from the negative pressure source to the suction pipe 192, the electronic component 82 is held by suction at the top surface 94 of its body 90 by the sucking end of the suction pipe 192. When a positive pressure is applied from the positive pressure source to the suction pipe 192, the electronic component 82 is released from the suction pipe 192. In the present embodiment, the suction nozzle 184 is arranged to hold the electronic component 82 in its horizontal attitude.

The pipe 210 is held, by its own weight, in abutting contact with the upper end face of the sleeve 190 of the suction nozzle 184 which is held by the nozzle holder 186. In this state, the pipe 210 is lifted and lowered with the suction nozzle 184. In the present embodiment, initiation of a relative movement between the nozzle holder 186 and the suction nozzle 184 is detected on the basis of a movement of the pipe 210. To this end, the pipe 210 is provided at its upper end with a reflector dog 222 fixed thereto, and a photoelectric switch 226 is fixedly disposed at an upper portion of the housing 212.

When the component mounting device 18 is not in operation to mount the electronic component 82, the reflector dog 222 is located below the photoelectric switch 226. In the present embodiment, the photoelectric switch 226 is of a reflection type which includes a light emitter and a light receiver and which generates an ON signal when a portion of the light emitted from the light emitter is reflected by the reflector dog 222 and received by the light receiver, and an OFF signal when the light emitted from the light emitter is not reflected by the reflector dog 222 and is not received by the light receiver. When the suction nozzle 184 is located at its lowermost position relative to the nozzle holder 186, therefore, the light emitted from the photoelectric switch 226 is not reflected by the reflector dog 222 and is not received by the photoelectric switch 226, so that the OFF signal is generated. When the suction nozzle 184 is moved upwards by a small distance from the lowermost position toward the nozzle holder 186, the emitted light is reflected by the dog 222, so that the ON signal is generated by the photoelectric switch 226. Thus, the initiation of the relative movement of the suction nozzle 184 and the nozzle holder 186 can be detected by the photoelectric switch 226. In the present embodiment, the pipe 210, reflector dog 222 and photoelectric switch 226 cooperate with each other to constitute a detecting device for detecting the initiation of a movement of the suction nozzle 184 relative to the nozzle holder 186.

A plurality of kinds of suction nozzle 184 are used to mount a plurality of kinds of electronic component 82 on the printed-wiring board 12. The different kinds of electronic component 82 usually have different sizes (at least one of the cross sectional area and the height dimension). Depending upon the sizes of the electronic component 82 of different kinds, the different kinds of the suction nozzle 184 whose suction pipes 192 have different diameters are used. Accordingly, the different kinds of the suction nozzle 184 whose suction pipes 192 have the respective different diameters are accommodated in a nozzle storage device, and are selectively used depending upon the kinds of the electronic component 82 to be mounted on the board 12. The suction pipes 192 having different diameters may have accordingly different lengths. For easier understanding of the present invention, the following description is based on an assumption that the suction pipes 192 of the suction nozzle 184 of different kinds have the same length.

The Y-axis slide 122 further carries a stationary image-taking device in the form of a fiducial mark camera 240 operable to take an image of a fiducial mark provided on the printed-wiring board 12, as shown in FIG. 1. In the present embodiment, the fiducial mark camera 240 is a CCD camera including CCDs (charge-coupled devices) and a lens system and capable of taking a two-dimensional image of an object. An illuminating device 242 is provided to illuminate the fiducial mark on the board 12, and its vicinity, when the image of the fiducial mark is taken by the fiducial mark camera 240.

The X-axis slide 106 is provided with two stationary image-taking devices 248, which are disposed at respective Y-axis positions at which the respective two ballscrews 104 are disposed. Namely, one of the two image-taking devices 248 is located between the component supply device 20 of feeder type and the PWB conveyor 14 (printed-wiring board 12 placed thereon), while the other image-taking device 248 is located between the component supply device 22 of tray type and the PWB conveyor 14. The two image-taking devices 248 are identical in construction with each other.

Each image-taking device 248 includes a component camera 250 for taking an image of the electronic component 82, and a waveguide device 251. The waveguide device 251 includes a reflecting device in the form of reflecting mirrors 252, 254, which are attached through respective brackets to the underside of the X-axis slide 106. The reflecting mirror 252 is disposed at a position within a path of movement of the component holding device 100 in the Y-axis direction, and has a reflecting surface 256 which is inclined about 45° with respect to a vertical plane including the centerline of the suction nozzle 184, such that one of the opposite ends of the reflecting surface 256 (as viewed in the X-axis direction) which is closer to the X-axis slide 106 is the lower end, that is, the left end of the reflecting surface 256 is the lower end.

The other reflecting mirror 254 is disposed on the side of the X-axis slide 106 which is remote from the reflecting mirror 252, and has a reflecting surface 258 which is inclined with respect to the vertical plane, symmetrically with the reflecting surface 256. The component camera 250 for taking the image of the electronic component 82 held by the suction nozzle 184 is located on the side of the X-axis slide 106 remote from the component holding device 100, such that the component camera 250 faces downwards toward the reflecting surface 258 of the reflecting mirror 254. In this arrangement, the image of the electronic component 82 held by the suction nozzle 184 can be taken by the component camera 250 when the component holding device 100 is moved by the XY positioning device 136 to the Y-axis position of the corresponding ballscrew 104 at which the electronic component 82 is located right above the reflecting mirror 252. Thus, the image-taking device 248 is arranged to image the electronic component 82 located at the predetermined image-taking position which lies within a path of movement of the electronic component 82 when the Y-axis slide 122 is moved in the Y-axis direction relative to the X-axis slide 106. In the present embodiment, the component camera 250 is a two-dimensional CCD camera, like the fiducial mark camera 240 described above. The reflecting mirror 254 may be eliminated. In this case, the component camera 250 is disposed so as to have a horizontal attitude and face toward the reflecting mirror 252.

A stroke light 260 as a UL irradiating device is disposed near the reflecting mirror 252, for irradiating the light emitting plate 206 of the suction nozzle 184 with a ultraviolet radiation. The light emitting plate 106 absorbs the ultraviolet radiation, and emits a visible light for illuminating the bottom surface 96 of the electronic component 82 held by the suction nozzle 184. The component camera 250 takes a silhouette image of the electronic component 82 in the axial direction of the suction nozzle 184, with the light emitting plate 206 used as a light background. In the present embodiment, the light emitting plate 206 and the stroke light 260 provided as the UV irradiating device cooperate to constitute an illuminating device for the image-taking device 248. Another strobe light 262 for emitting a visible light is disposed nearer to the suction nozzle 184 than the above-indicated strobe light 260. This strobe light 262 serves as an illuminating device for illuminating the ball-grid array at a relatively small angle with respect to the bottom surface 96 of the electronic component 82. The strobe light 260 may be used as an illuminating device for irradiating the bottom surface 96 of the electronic component 82 with a visible light, for taking a normal image of the electronic component 82 rather than a silhouette image. If necessary, the image-taking device 248 may use two illuminating devices which are selectively used for taking the silhouette image and the normal image of the electronic component 82, respectively.

Figure 3:
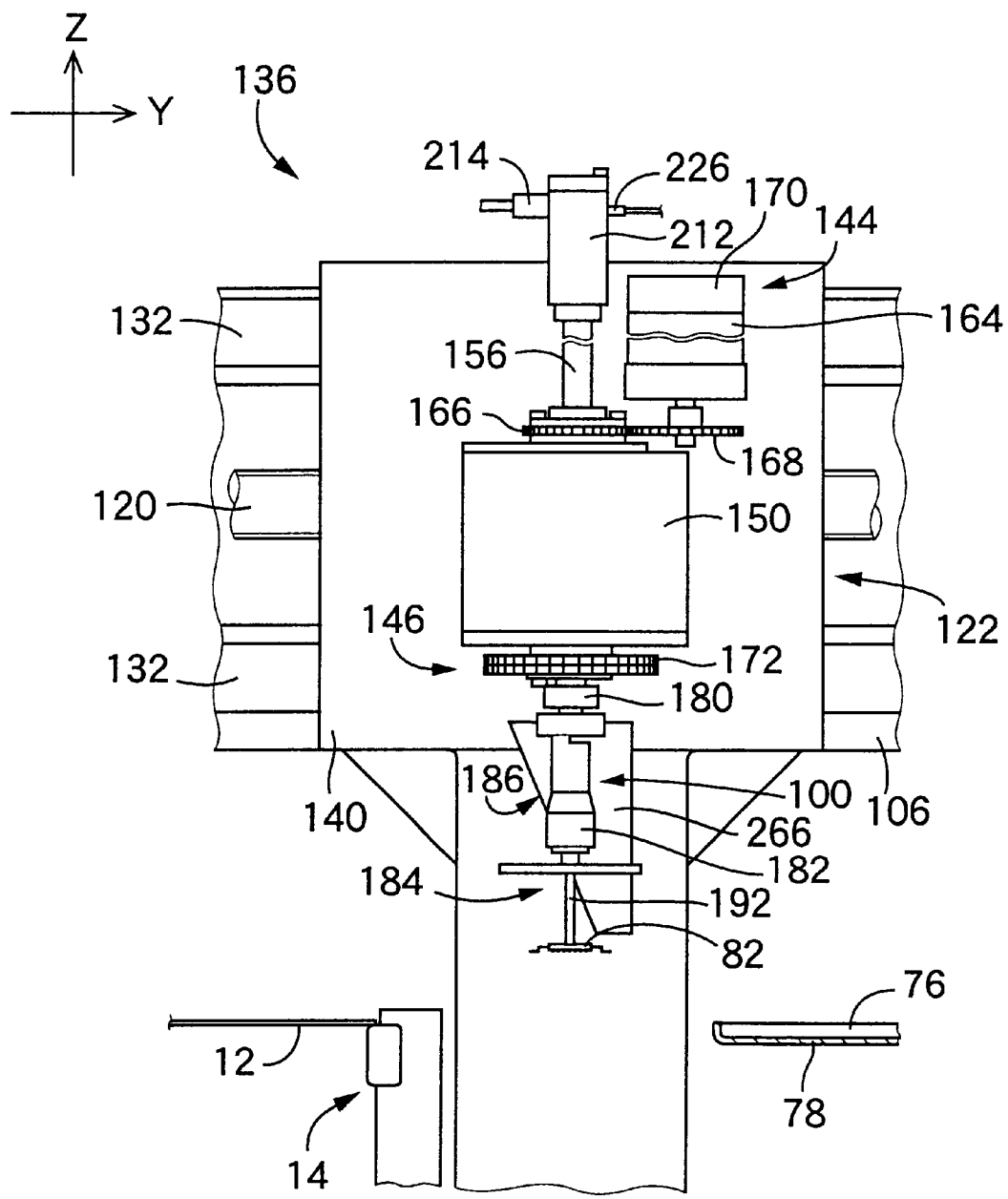
FIG. 3 is a front elevational view showing a component mounting device in the electronic-component mounting system.
Figure 10:
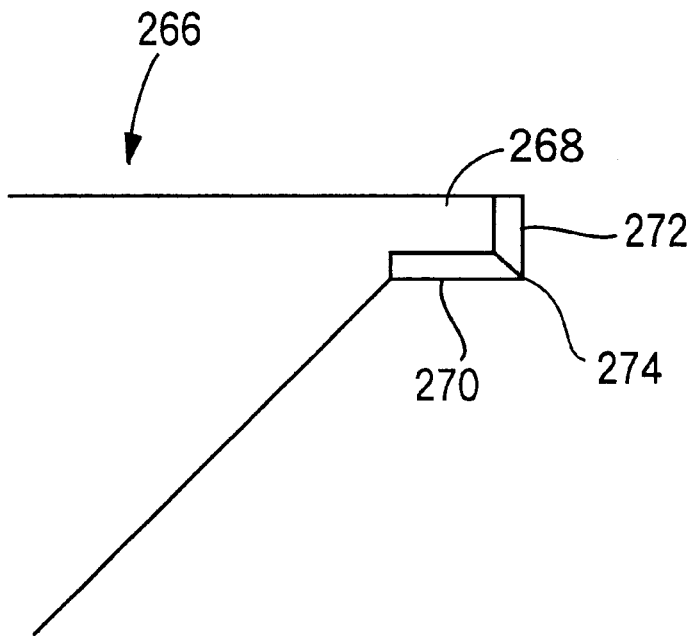
FIG. 10 is a plan view showing a part of a dog provided in the electronic-component mounting system.
Figure 11:
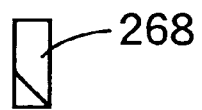
FIG. 11 is a front elevational view of a part of the dog of FIG. 10.
Figure 12:
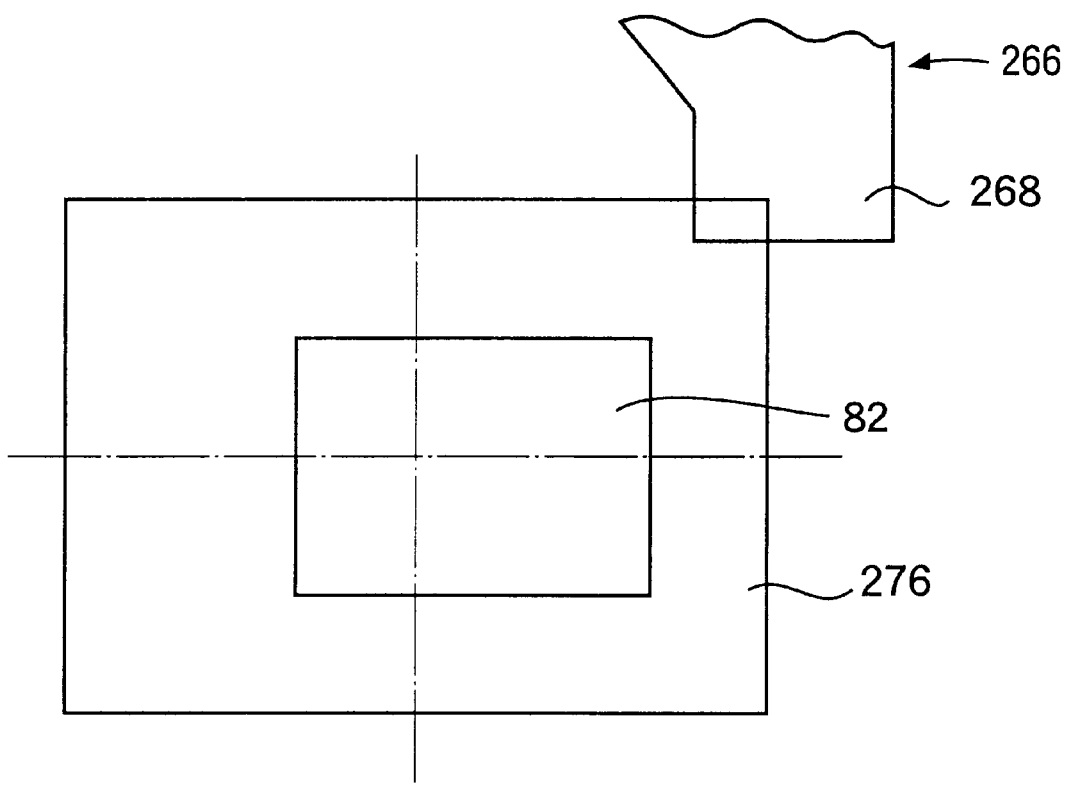
FIG. 12 is a view for explaining a manner of taking an image of the dog together with an image of the electronic component.

In the vicinity of the component holding device 100, there is disposed a dog 266 as shown in FIGS. 3 and 4. The dog 266 is attached to the Y-axis slide 122 through a bracket 267, and has a sensed portion 268 at its lower end, as shown in FIGS. 10 and 11. The sensed portion 268 has a rectangular shape, and is chamfered at adjacent two sides of the rectangle, so as to provide two sharp edges 270, 272 of an acute angle which intersect each other at right angles, at an apex 274, as indicated in FIG. 10. The position of the apex 274 is used as the position of the dog 266. The dog 266 is positioned so that an image of the sensed portion 268 of the dog 266 is taken in one corner portion of an imaging area 276 of the component camera 250, together with an image of the electronic component 82, as shown in FIG. 12. In the example of FIG. 12, the electronic component 82 has a ball-grid array. In FIG. 12, the images of the electronic component 82 and the sensed portion 268 are indicated by the same reference numerals as used for these elements 82, 268. The same is true in FIGS. 13–21 which will be referred to in the following description.

The present electronic-component mounting system is provided with two mounting surfaces 282, 284, which are located near respective two diagonally opposed corners of a rectangular region in which the component holding device 100 is moved by the XY positioning device 136. Described more specifically by reference to FIG. 1, the first mounting surface 282 is located near the end of the ballscrew 104 on the side of the component supply device 20 of feeder type, which end is nearer to the corresponding X-axis drive motor 110, while the second mounting surface 282 is located near the end of the other ballscrew 104 on the side of the component supply device 22 of tray type, which end is remote from the corresponding X-axis drive motor 110. The first mounting surface 282 is located near zero points or home positions of the X-axis and Y-axis slides 106, 122, while the second mounting surface 282 is located farthest from the zero points in the X-axis and Y-axis directions. A fiducial chip 286 is placed on a selected one of the two mounting surfaces 282, 284. The ballscrews 104, 120 are rotatably supported, at their end portions connected to the X-axis and Y-axis drive motors 110, 126, by the machine base 10 and the X-axis slide 106, respectively, such that these end portions are not axially movable relative to the machine base 10 and the X-axis slide 106, respectively, but are rotatably supported at the other end portions such that these other end portions are axially movable relative to the machine base 10 and the X-axis slide 106, respectively. Accordingly, the amounts of thermal deformation and elastic deformation of the ballscrews 104, 120 are smaller at their end portions near the mounting surface 282, than those at their end portions near the mounting surface 284. The mounting surface 282 is desirably located at a position at which the thermal deformation and elastic deformation of the ballscrews 104, 120 are negligibly small. However, the two mounting surfaces 282, 284 may be located near respective two diagonally opposite corners of the rectangular printed-wiring board 12 supported by the printed-wiring board support device 26, at its component mounting position. In this case, the two diagonally opposite corners of the board 12 correspond to the above-indicated two corners of the rectangular region of movement of the component holding device 100. The fiducial chip 286 is a planar member having rectangular opposite major surfaces. The four sides of the rectangular planar member may be used as detected portions when an image of the fiducial chip 286 is taken. Alternatively, the upper surface of the rectangular planar member has detected portions whose optical properties are different from the other portion. For easier understanding, the following description is based on an assumption that the four sides of the rectangular fiducial chip 286 are used as the detected portions.

The present electronic-component mounting system is provided with control means in the form of a control device 300 illustrated in FIG. 9. The control device 200 is principally constituted by a computer incorporating a processing unit (PU) 302, a read-only memory (ROM) 304, a random-access memory (RAM) 306, and a bus 308 interconnecting those elements 302, 304, 306. The bus 308 is connected to an image input interface 312 to which are connected the fiducial mark camera 240 and component camera 250 which have been described above. The bus 308 is also connected to a servo interface 314 to which are connected various actuators such as the X-axis drive motors 110, Y-axis drive motor 126, Z-axis drive motor 164 and nozzle rotating motor 174. In the present embodiment, the X-axis drive motors 110 are servo motors. However, the X-axis drive motors may be electric motors of other types such as stepping motors, as long as the amount of operation of the electric motors can be controlled.

The bus 308 is also connected to a digital input interface 318 and a digital output interface 320. To the digital input interface 318, there are connected the encoders 170, 176 described above, and other encoders such as those for detecting the amount of operation of the X-axis drive motors 110. To the digital output interface 320, there are connected the printed-wiring board feed motor (PWB feed motor) 36, a control valve for the elevator cylinder 52, and other actuators. The RAM 306 stores various control programs such as those for executing a main control routine, a relative-position obtaining routine, and a component mounting control routine. The control device 360 also controls operations of the fiducial mark camera 240 and the image-taking devices 248.

The present electronic-component mounting system is arranged to obtain actual relative positions of those sections of the system which influence the component mounting accuracy, and compensate the position of the electronic component 82 for deviations of the obtained actual relative positions with respect to the nominal relative positions, before mounting of the electric component 82 on the printed-wiring board 12, in order to avoid deterioration of the component mounting accuracy due to the deviations. Described in detail, the electric-component mounting system is adapted to automatically detect the amounts and directions of deviations of the actual relative positions among the image-taking devices 248 (each consisting of the component camera 250 and waveguide device 251), the fiducial mark camera 240 and the suction nozzle 184, with respect to the nominal relative positions, so that the position of the electronic component 82 is compensated for the detected deviations, before the electronic component 82 is mounted on the printed-wiring board 12. In the present embodiment, the positions of the image-taking devices 248 and fiducial mark camera 240 are represented by the positions of their optical axes, that is, by the center points of the imaging areas of the image-taking devices 248 and fiducial mark camera 240. The present embodiment is further arranged such that the positions of the fiducial mark camera 240 and the suction nozzle 184 are defined with respect to the center point of the imaging area of each image-taking device 248 in the XY coordinate system in which the X-axis and Y-axis slides 106, 122 are moved in the X-axis and Y-axis directions. The XY coordinate system has the zero point which is located at one corner of the rectangular region of movements of the slides 106, 122, which corner is nearest to the X-axis drive motors 110 and the Y-axis drive motor 126.

Initially, the relative-position obtaining routine is executed to move the suction nozzle 184 to coordinate position (X1, Y1) of the optical axis of the image-taking device 248. The movement of the suction nozzle 184 to the coordinate position (X1, Y1) by the XY positioning device 136 is controlled by the control device 300 on the basis of the output signals of the encoders provided for the X-axis drive motors 110 and the Y-axis drive motor 126. If the electronic-component mounting system is manufactured according to the designed specification, the center position of the end face of the suction nozzle 184 is located on the optical axis of the image-taking device 248, namely, aligned with the center of the imaging area of the image-taking device 248. Actually, however, the center position of the end face of the suction nozzle 184 is usually more or less offset from the center of the imaging area. To detect the amount of this offset, the image-taking device 248 is operated to take an image of the end face of the suction nozzle 184, and an image of the sensed portion 268 of the dog 266, as indicated by solid lines in FIG. 13.

Figure 13:
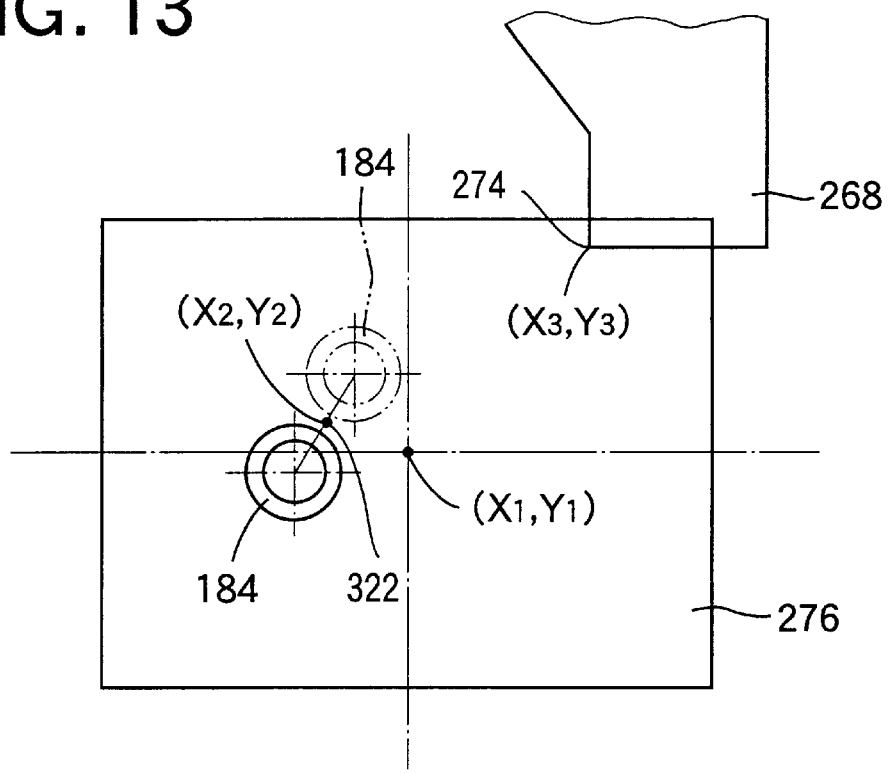
FIG. 13 is a view for explaining a manner of obtaining the position of the axis of rotation of a suction nozzle in the electronic-component mounting system.
Figure 14:
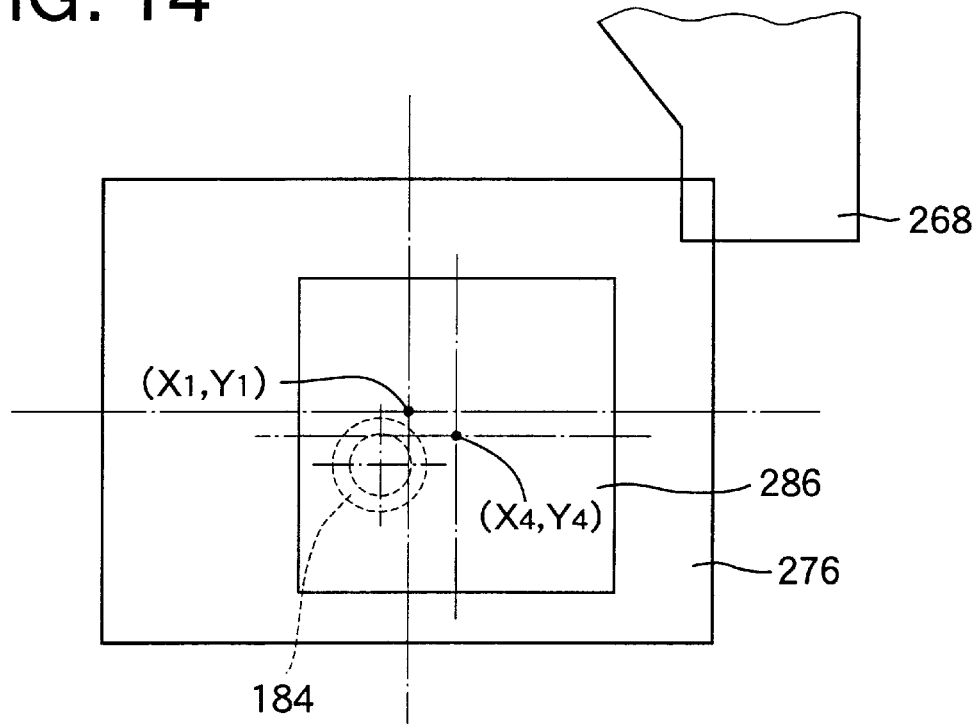
FIG. 14 is a view for explaining a manner of taking an image of a fiducial chip as held by the suction nozzle in the electronic-component mounting system.

Then, the component holding device 100 (nozzle holder 186) is rotated by 180°, and an image of the end face of the suction nozzle 184 is taken as indicated by two-dot chain line in FIG. 13. Alternatively, the component holding device 100 is rotated three times at an angular interval of 90°, and an image of the end face of the suction nozzle 184 is taken at each of the three angular positions of 90°, 180° and 270°. By processing image data representative of the images of the end face of the suction nozzle 184 at the two or four different angular positions, the X-axis and Y-axis coordinate values of the center position of the suction nozzle 184 at the different angular positions are obtained. Coordinate values X2, Y2 of the axis of rotation 322 of the suction nozzle 184 are obtained by calculating averages of the X-axis and Y-axis coordinate values of the center position of the suction nozzle 184 obtained at the different angular positions. Coordinate values X3, Y3 of the apex 274 of the sensed portion 268 of the dog 266 are calculated by processing image data representative of the image of the sensed portion 268. The rotation axis 322 is the axis of rotation of the nozzle holder 186. A difference DX=X3−X2 between the X-axis coordinate values X2 and X3, and a difference DY=Y3−Y2 between the Y-axis coordinate values Y2 and Y3 are stored in the RAM 306 as coordinate data representative of a relative position between the dog 266 (apex 274 of its sensed portion 268) and the rotation axis 322 of the suction nozzle 184. In addition, differences ΔX1=X2−X1, and ΔY1=Y2−Y1 are stored in the RAM 306, as data representative of a positional deviation of the rotation axis 322 of the suction nozzle 184 with respect to the optical axis of the image-taking device 248. Thus, the relative position between the dog 266 and the rotation axis 322 of the suction nozzle 184, and the relative position between the rotation axis 322 and the optical axis of the image-taking device 248 are detected. Although an operation to detect each of those relative positions may be performed only once, it is desirable to perform two or more operations to obtain a plurality of data sets so that each relative position is determined on the basis of the two or more data sets. The same is true for other kinds of data which will be described.

Then, the suction nozzle 184 is moved to a predetermined Z-axis position right above the mounting surface 282, and is lowered to hold the fiducial chip 286. The suction nozzle 184 holding the fiducial chip 286 is then moved in the XY plane to a position in alignment with the image-taking device 248. At this time, the suction nozzle 184 is moved such that the rotation axis 322 detected as described above is aligned with the optical axis (X1, Y1) of the image-taking device 248, by compensating the distances of movement by ΔX1=X2−X1, and ΔY1=Y2−Y1, in the X-axis and Y-axis directions. Then, an image of the fiducial chip 286 as held by the suction nozzle 184 is taken. By processing image data representative of the image of the fiducial chip 286, coordinate values X4, Y4 of the center position of the chip 286 are obtained. Differences ΔX2=X4−X1, and ΔY2=Y4−Y1 are stored in the RAM 306, as data representative of a positional deviation of the fiducial chip 286 with respect to the rotation axis 322 of the suction nozzle 184, that is, with respect to the optical axis of the image-taking device 248. Actually, the center position of the fiducial chip 286 is usually more or less offset from the optical axis of the image-taking device 248, and the angular position of the fiducial chip 286 in the imaging area 276 of the image-taking device 248 more or less deviates from the nominal angular position, that is, the fiducial chip 286 has an angular positioning error as well as the center position error. In the interest of simplification, the following description is based on an assumption that there is no angular positioning error among the image-taking device 248, fiducial mark camera 240 and fiducial chip 268.

Figure 15:
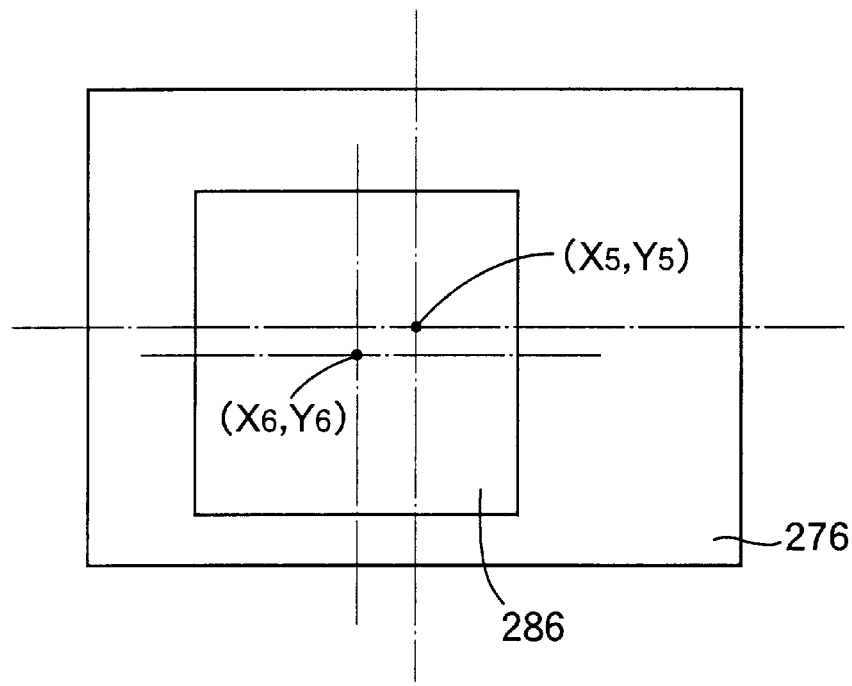
FIG. 15 is a view for explaining a manner of obtaining a positioning error of a fiducial mark camera in the electronic-component mounting system.
Figure 16:
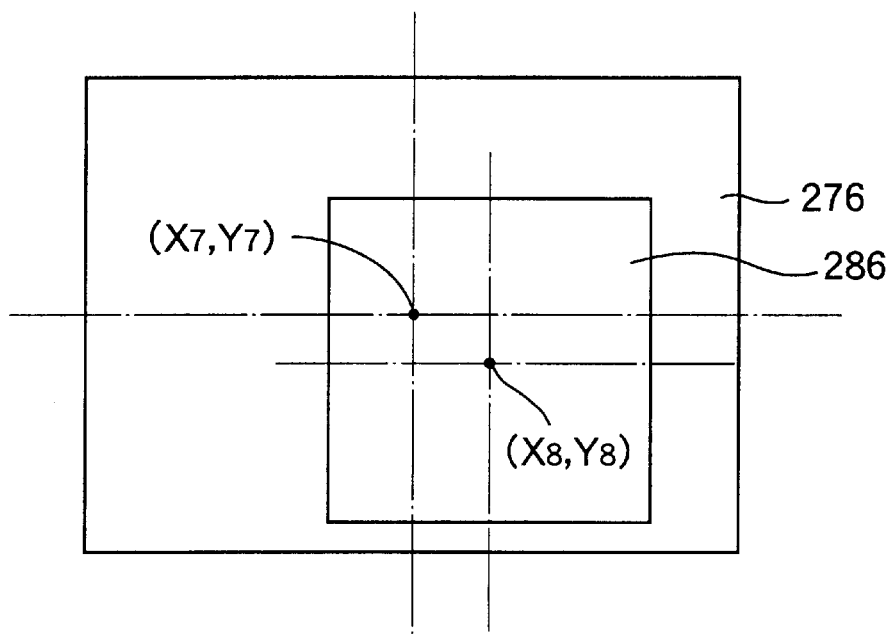
FIG. 16 is a view for explaining a manner of obtaining an operational error of an XY positioning device in the electronic-component mounting system.

Then, the position of the suction nozzle 184 in the XY plane is compensated for the center position error of the fiducial chip 286 with respect to the position (X1, Y1) of the optical axis of the imaging-device 248, and the suction nozzle 184 is moved to a position at which the center of the fiducial chip 286 is aligned with a predetermined mounting position (X5, Y5) on the mounting surface 282. With the suction nozzle 184 located at this position, the fiducial chip 286 is placed on the mounting surface 282. Theoretically, the center of the fiducial chip 286 thus placed on the mounting surface 282 is located at the predetermined mounting position (X5, Y5). Then, the fiducial mark camera 240 is moved so that its optical axis is aligned with the predetermined mounting position (X5, Y5), and an image of the fiducial chip 286 is taken by the fiducial mark camera 240, as indicated in FIG. 15. By processing image data representative of the image of the fiducial chip 286, coordinate values X6, Y6 of the center position of the fiducial chip 286 are obtained. In the presence of some misalignment of the optical axis of the fiducial mark camera 240 with respect to the optical axis of the image-taking device 248, the center position of the fiducial mark 268 as represented by the obtained image actually deviates from the predetermined mounting position (X5, Y5) by ΔX3=X6−X5, and ΔY3=Y5−Y6. This means that the amounts of misalignment of the optical axis of the fiducial mark camera 240 with respect to the optical axis of the image-taking device 248 are equal to −ΔX3=−(X6−X5), and −ΔY3=−(Y5−Y6) in the X-axis and Y-axis directions.

It will be understood from the above description that in the coordinate system of the image-taking device 248, the suction nozzle 184 has a center position error of ΔX1=X2−X1, and ΔY1=Y2−Y1, while the fiducial mark camera 240 has an optical axis misalignment of −ΔX3=−(X6−X5), and −ΔY3=−(Y5−Y6). The data representative of the center position error of the suction nozzle 184, and the data representative of the optical axis misalignment of the fiducial mark camera 240 are stored in the RAM 306, as data representative of the relative position between the image-taking device 248 and the suction nozzle 184, and data representative of the relative position between the image-taking device 248 and the fiducial mark camera 240.

Then, the position of the suction nozzle 184 in the XY plane is adjusted for alignment of its rotation axis 322 with the predetermined mounting position (X5, Y5), and the suction nozzle 184 is lowered to again hold the fiducial chip 286. Accordingly, the center position of the fiducial chip 286 held by the suction nozzle 184 is theoretically aligned with the rotation axis 322 of the suction nozzle 184. In the present embodiment, whether this alignment is established or not is checked by taking an image of the fiducial mark 268 by the image-taking device 248 and processing the thus obtained image data. However, this checking is not essential. If the checking reveals that the center position of the fiducial chip 286 is not aligned with the rotation axis 322, it means that the operations to detect the relative positions among the image-taking device 248, suction nozzle 184 and fiducial mark camera 240 have not been correctly performed. In this case, the operations to detect the relative positions are repeated to establish the alignment. Usually, however, the alignment is established by an initial cycle of the operations.

Then, the suction nozzle 184 is moved in the XY plane to a predetermined mounting position (X7, Y7) on the mounting surface 284, and is lowered to place the fiducial chip 286 on the mounting surface 284. This movement of the suction nozzle 184 to the coordinate position (X7, Y7) is also controlled by the control device 300 on the basis of the output signals of the encoders provided for the X-axis drive motors 110 and the Y-axis drive motor 126. Then, the fiducial camera 240 is moved so that its optical axis is aligned with the predetermined mounting position (X7, Y7), and an image of the fiducial chip 286 is taken by the fiducial mark camera 240. The movement of the suction nozzle 184 and the movement of the fiducial mark camera 240 are effected after the XY positions of the suction nozzle 184 and the fiducial mark camera 240 are compensated for the center position error of the suction nozzle 184 and the misalignment of the fiducial mark camera 240 with respect to the image-taking device 240, which have been obtained. In the absence of an operating error of the XY positioning device 136, therefore, the coordinate values of the center position of the fiducial chip 286 as obtained by processing the obtained image data are theoretically equal to the coordinate values X7, Y7 of the predetermined mounting position on the mounting surface 284. Actually, however, coordinate values X8, Y8 of the center position of the fiducial chip 286 are different from the coordinate values X7, Y7 of the predetermined mounting position, by ΔX4=X8−X7, and ΔY4=Y8−Y7.

The above-indicated differences ΔX4=X8−X7, and ΔY4=Y8−Y7 are considered to arise from an operating error of the XY positioning device 136, which takes place due to manufacturing errors, elastic deformation and thermal deformation of the ballscrews 104, 120 and other elements of the XY positioning device 136. The manufacturing error and the elastic deformation do not change with the operating time of the electronic-component mounting system, but the thermal deformation changes with the operating time. In this respect, it is desirable to detect the above-indicated positional error ΔX4=X8−X7, and ΔY4=Y8−Y7 in the same manner as described above, at a suitable time interval during an operation of the electronic-component mounting system, or at a suitable point or points of time at which the detection does not disturb the mounting operation of the electronic component 82. For a similar reason, it is desirable to detect the relative positions among the image-taking device 248, suction nozzle 184 and fiducial mark camera 240, with the fiducial chip 286 placed on the mounting surface 282, at a suitable time interval or at a suitable point or points of time during the operation of the system. That is, the members which support the image-taking device 248, suction nozzle 184 and fiducial mark camera 240 also undergo thermal deformation due to a variation of the operating temperature.

Figure 17:
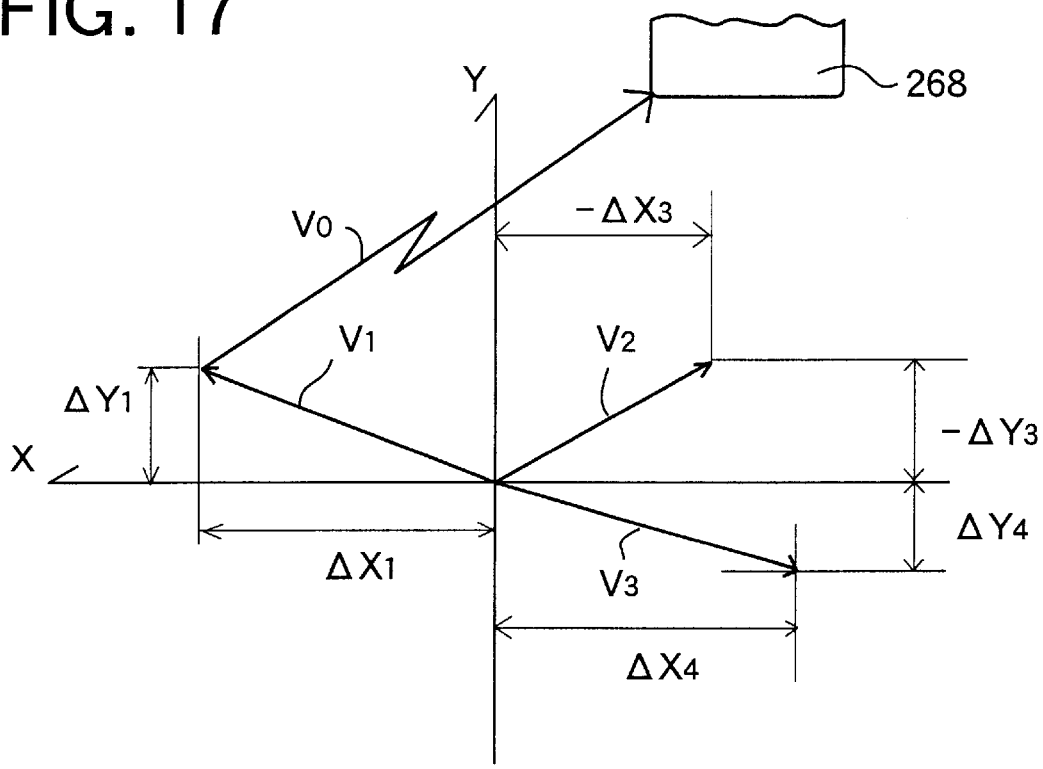
FIG. 17 is a view indicating a relative position between the dog and the axis of the suction nozzle, errors of relative position among the suction nozzle, an image-taking device and the fiducial mark camera, and an operational error of the XY positioning device, in the electronic-component mounting system.
Figure 18:
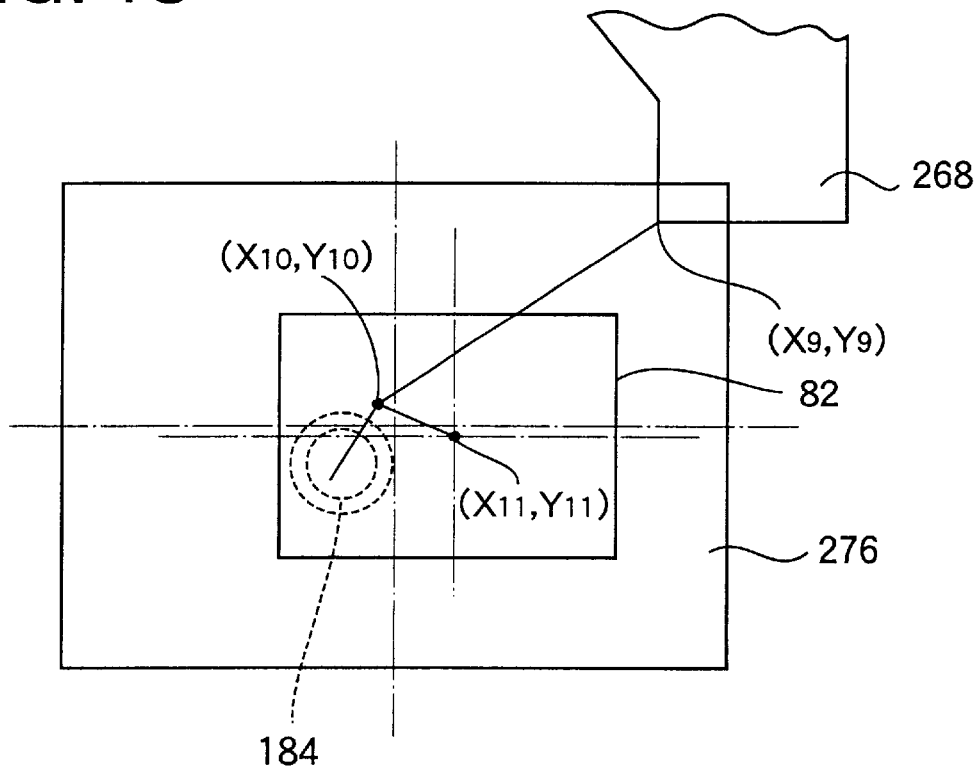
FIG. 18 is a view for explaining a manner of obtaining a positioning error of the electronic component with respect to the axis of rotation of the suction nozzle in the electronic-component mounting system.

As described above, the following sets of data are obtained before the electronic component 32 is mounted on the printed-wiring board 12 according to the component mounting control routine: relative position data DX=X3−X2, DY=Y3−Y2 representative of the relative position between the dog 266 and the rotation axis 322 of the suction nozzle 184, as indicated by a vector V0 in FIG. 17; positional deviation data ΔX1=X2−X1, and ΔY1=Y2−Y1 representative of the deviation of the rotation axis 322 of the suction nozzle 184 with respect to the optical axis of the image-taking device 248, as indicated by a vector V1 in FIG. 17; optical misalignment data −ΔX3=−(X6−X5), and −ΔY3=−(Y5−Y6) representative of the optical axis misalignment of the fiducial mark camera 240 with respect to the optical axis of the image-taking device 248, as indicated by a vector V2 in FIG. 17; and operating error data ΔX4=X8−X7, and ΔY4=Y8−Y7 representative of the operating error of the XY positioning device 136, as indicated by a vector V3 in FIG. 17.

The component mounting operation is initiated with detection of the positioning error of the printed-wiring board 12 which has been transferred by the PWB conveyor 14 and supported by the printed-wiring board support device 26. This detection is effected by processing the image data representative of the image of the fiducial mark 286 taken by the fiducial mark camera 240. Then, the electronic component 82 is received by the suction nozzle 184 from the component supply device 20 or 22, and the positioning error of the electronic component 82 with respect to the rotation axis 322 of the suction nozzle 184 is detected by processing the image data representative of the image of the electronic component 82 taken by the image-taking device 248. The positioning errors of the printed-wiring board 12 and the electronic component 82 are eliminated by adjusting predetermined component mounting control data, so that the electronic component 82 is mounted in position on the printed-wiring board 12.

The aspects of the component mounting operation of the present electronic-component mounting system which have been described are the same as in the conventional system. However, the component mounting operation in the present embodiment is different from that in the conventional system, in that the suction nozzle 184 and the fiducial mark camera 240 are moved to eliminate the deviation $\Delta X1=X2-X1$, and $\Delta Y1=Y2-Y1$ of the rotation axis 322 of the suction nozzle 184 with respect to the optical axis of the image-taking device 248, and the optical axis misalignment $-\Delta X3=-(X6-X15)$ and $-\Delta Y3=-(Y5-Y6)$ of the fiducial mark camera 240 with respect to the optical axis of the image-taking device 248, when the positioning errors of the printed-wiring board 12 and the electronic component 82 are detected.

Further, the image of the sensed portion 268 of the dog 266 is taken together with the image of the electronic component 82, upon detection of the positioning error of the electronic component 82 with respect to the rotation axis 322 of the suction nozzle 184, in order to obtain coordinate values X9, Y9 of the apex 274 of the sensed portion 268, so that coordinate values X10, Y10 of the rotation axis 322 of the suction nozzle 184 are estimated on the basis of the obtained coordinate values X9, Y9 of the apex 274, and the already obtained relative position data $DX=X3-X2$, and $DY=Y3-Y2$ representative of the relative position of the apex 274 and the rotation axis 322 of the suction nozzle 184. Coordinate values X11, Y11 of the center position of the electronic component 82 are detected n the basis of the thus obtained coordinate values X10, Y10 of the rotation axis 22. In this aspect, too, the present embodiment is different from the prior art.

The end face of the suction nozzle 184 is hidden by the electronic component 82 and is not visible, while the sensed portion 268 of the dog 266 is visible, so that the image of the sensed portion 268 is taken by the image-taking device 248, to estimate the position of the rotation axis 322 of the suction nozzle 184 on the basis of the thus obtained image data of the sensed portion 268 and the already detected relative position between the sensed portion 268 and the rotation axis 322 of the suction nozzle 184. In this respect, it is noted that the rotation axis 322 of the suction nozzle 184 is theoretically located on the optical axis of the image-taking device 248 immediately after the position of the suction nozzle 184 is compensated for the positioning error of its rotation axis 322 with respect to the optical axis of the image-taking device 248, on the basis of the detected relative position therebetween. However, the rotation axis 322 tends to deviate from the optical axis of the image-taking device 248 due to a rise of the operating temperature at various local portions of the electronic-component mounting system with an increase in the operating time of the system. In view of this tendency, the present system is arranged to estimate the position of the rotation axis 322 of the suction nozzle 184 at the predetermined time interval during the operation of the system. Since this estimation can be made in a relatively short time, the estimation may be made upon detection of the positioning error of each electronic component 82 relative to the suction nozzle 184, that is, for each component 82 to be mounted on the printed-wiring board 12.

The present electronic-component mounting system is further arranged to adjust the component mounting control data so as to eliminate the operating error $\Delta X4=X8-X7$, and $\Delta Y4=Y8-Y7$ of the XY positioning device 136, as well as the positioning errors of the center position of the electronic component 82 with respect to the rotation axis 322 of the suction nozzle 184 and the positioning error of the printed-wiring board 12, when the electronic component 82 is positioned relative to the suction nozzle 184 before mounting of the component 82 on the printed-wiring board 12. The adjustment of the component mounting control data to eliminate the operating error of the XY positioning device 136 may be made on an assumption that the operating error increases in proportion to distances in the X-axis and Y-axis directions between the predetermined mounting position on the mounting surface 282 and the position at which the electronic component 82 is mounted on the printed-wiring board 12.

Described more specifically, the operating error of the XY positioning device 136 for the movement of the suction nozzle 184 from the mounting surface 282 to the mounting surface 284 is represented by the X-axis error $\Delta X4=X8-X7$, and the Y-axis error $\Delta Y4=Y8-Y7$, as indicated by the vector V3 in FIG. 17. Therefore, the operating error of the XY positioning device 136 at the specific component mounting position on the printed-wiring board 12 is represented by a product $K_X \cdot \Delta X4$ and a product $K_Y \cdot \Delta Y4$, where "$K_X$" represents a ratio of the distance in the X-axis direction between the predetermined mounting position on the mounting surface 282 and the component mounting position on the board 12, to a distance in the X-axis direction between the predetermined mounting positions on the two mounting surfaces 282, 284, while "$K_Y$" represents a ratio of the distance in the Y-axis direction between the predetermined component mounting position on the mounting surface 282 and the component mounting position on the board 12, to a distance in the Y-axis direction between the predetermined mounting positions on the mounting surfaces 282, 284. Accordingly, the component mounting control data are adjusted by adding the products $K_X \cdot \Delta X4$ and $K_Y \cdot \Delta Y4$ to the nominal distances of movement of the suction nozzle 184 in the X-axis and Y-axis directions, for eliminating the operating error of the XY positioning device 136 for the specific component mounting position on the board 12. Since the operating error $\Delta X4$ and $\Delta Y4$ of the XY positioning device 136 for the distances between the mounting surfaces 282, 284 varies with the operating time of the electronic-component mounting system, the operating error is updated from time to time during the operation of the system.

Where the angular position of the electronic component 82 as received by the suction nozzle 184 from the component supply device 20, 22 is different from the angular position of the electronic component 82 as mounted on the printed-wiring board 12, the suction nozzle 184 is rotated by a suitable angle before the electronic component 84 is mounted on the board 12. In this case, too, the electronic component 82 can be mounted on the board 12 with high accuracy of positioning of the center position of the electronic component 82 relative to the board 12. Namely, the present electronic-component mounting system is arranged to detect the positioning error of the electronic component 82 relative to the rotation axis 322 of the suction nozzle 184, for accurately calculating the center position error of the electronic component 82 which arises from the rotation of the suction nozzle 184, so that the relative position between the suction nozzle 184 and the printed-wiring board 12 can be compensated for the calculated center position error of the electronic component 82.

While the foregoing description is based on an assumption that the fiducial chip 286 and the electronic component 82 held by the suction nozzle 184 do not have an angular position error relative to the suction nozzle 184, there are actually the angular positioning errors between the fiducial chip 286 and electronic component 82 and the suction nozzle 184. To eliminate these angular positioning errors, the angular positions of the fiducial chip 286 and the electronic component 82 are obtained by processing the image data representative of the images of the fiducial chip 286 and the electronic component 82 in the imaging area 276 of the image-taking device 248. Before When the fiducial chip 286 is mounted on the mounting surfaces 282, 284 and before the electronic component 82 is mounted on the board 12, the suction nozzle 184 holding the fiducial chip 286 or electronic component 82 is rotated by a suitable angle to eliminate the angular positioning error. To this end, the image-taking device 248 and the fiducial mark camera 240 must be adjusted to reduce their angular positioning errors to a negligibly small value. The angular positioning errors of the image-taking device 248 and the fiducial mark camera 240 can be detected as described below in detail.

It will be understood from the foregoing description of the first embodiment of this invention that the XY positioning device 136 serves as a relative-movement device operable to move the suction nozzle 184 and the fiducial mark camera 240 relative to the component supply devices 20, 22 and the printed-wiring board support device 26, and that the control device 300 serves as a component-mounting control device operable to control the XY positioning device 136 and the suction nozzle 184 such that the electric component in the form of the electronic component 82 received by the suction nozzle 184 from the component supply devices 20, 22 is mounted at a predetermined position on the printed-wiring board 12 supported by the printed-wiring board support device 26. It will also be understood that the image-taking device 284 and the fiducial mark camera 240 respectively function as a first and a second image-taking device which are arranged to take an image of the suction nozzle in a direction of extension of the suction nozzle and an image of the fiducial mark provided on the circuit substrate in the form of the printed-wiring board 12, respectively, while the control device 300 functions as an image-taking control device or image-taking control means for controlling the image-taking device 248 and the fiducial mark camera 240 to take the images of the suction nozzle 184 and the fiducial mark provided on the board 12, respectively, and that the control device 300 also functions as a data processing device operable to process image data obtained by the image-taking device 248 and the fiducial mark camera 240. It will further be understood that a portion of the data processing device constitutes a rotation-axis obtaining portion operable to obtain the position of an axis of rotation of the suction nozzle, while a portion of the image-taking control means constitutes a plural-imaging control portion operable to rotate the suction nozzle 184 at least once and control the image-taking device 248 for taking images of the end face of the suction nozzle 184 placed in at least two different angular positions. It will also be understood that the control device 300 further functions as positioning-error obtaining means for obtaining a positioning error of the fiducial chip 286 with respect to the suction nozzle 184 on the basis of the images of the fiducial chip and the dog, and the relative positions among the suction nozzle 184, dog 266 and fiducial chip 286, fiducial-chip mounting control means for moving the suction nozzle 184 and the printed-wiring board support device 26, and controlling the suction nozzle 184 to place the fiducial chip 286 on the mounting surfaces 282, 284, and fiducial-chip imaging control means for operating the fiducial mark camera 240 to take an image of the fiducial chip 286 placed on the mounting surfaces 282, 284. It will further be understood that the control device 300 also functions as: relative-position obtaining means for obtaining relative positions among the suction nozzle 184, image-taking device 284 and fiducial mark camera 240; fiducial-mark imaging control means for operating the fiducial mark camera 240 to take an image of the fiducial mark provided on the printed-wiring board 12 supported by the support device 26; substrate-positioning-error obtaining means for obtaining a positioning error of the printed-wiring board 12 on the basis of the image of the fiducial mark 286; electric-component imaging control means for controlling the suction nozzle 184 to hold the electric component in the form of the electronic component 82, and operating the image-taking device 284 to take an image of the electric component held by the suction nozzle 184; and mounting control means for compensating the relative position between the printed-wiring board support device 26 and the suction nozzle 184, on the basis of image data of the electric component taken by the image-taking device 248, the relative positions among the suction nozzle 184, image-taking device 284 and fiducial mark camera 240 which have been obtained by the above-indicated relative-position obtaining means, and the positioning error of the printed-wiring board 12 obtained by the substrate-positioning-error obtaining means, so that the electric component is mounted at a predetermined position on the printed-wiring board 12.

It will also be understood that the RAM 306 function as: a first recording medium for storing a control program for detecting the positioning error of the electric component; a second recording medium for storing a control program for obtaining the relative positions among the suction nozzle 184, image-taking device 248 and fiducial mark camera 240; and a third recording medium for storing a control program for controlling the XY positioning device 136 and the suction nozzle 184 to accurately mount the electric component at the predetermined position on the printed-wiring board 12, while utilizing data indicative of the above-indicated relative positions, the operating error of the XY positioning device 136 and the positioning errors of the electric component and the printed-wiring board 12. In this respect, it is noted that the control programs indicated above are stored in a memory device of a host computer to which the present electronic-component mounting system is connected, and are down-loaded into the RAM 306 as needed. However, the control programs may be stored in a floppy disc or other removable recording medium which is readable by a reading device provided in the present mounting system per se or the host computer, so that the appropriate control program is executed by the control device 300, as needed.

Figure 19:
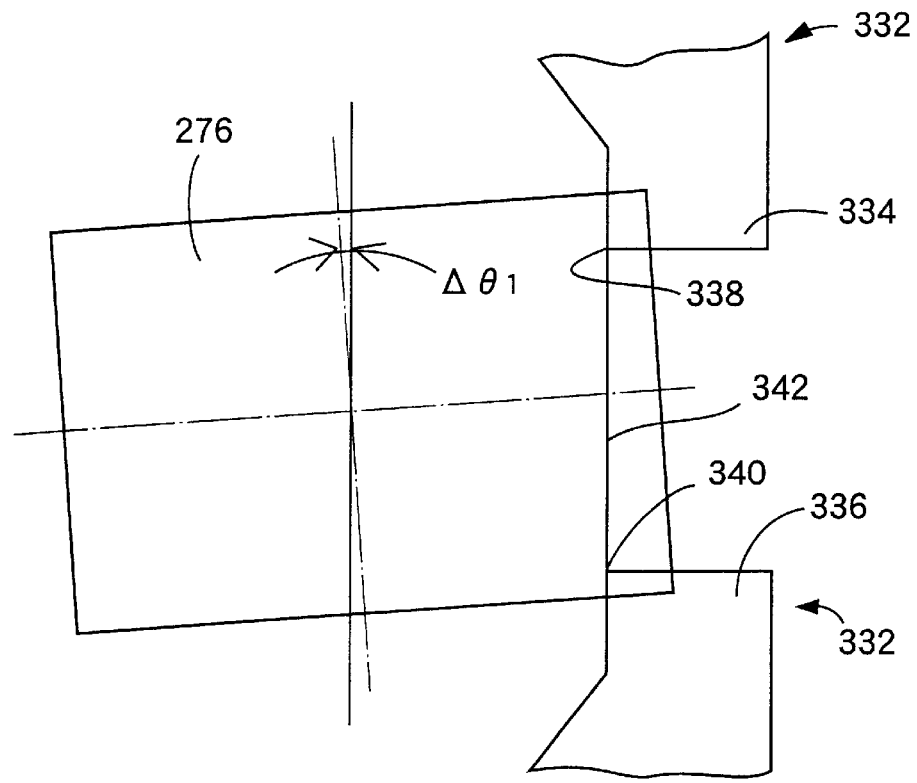
FIG. 19 is a view for explaining a manner of obtaining an angular positioning error of the image-taking device in an electronic-component mounting system according to another embodiment of the present invention.

In the first embodiment of FIGS. 1–18, only one dog 266 is provided. However, two dogs 332 may be provided as shown in FIG. 19, so that images of sensed portions 334, 336 of the two dogs 332 are formed at respective two adjacent corner portions of a rectangular imaging area 278 of the image-taking device 248, which two corner portions are spaced apart from each other in the X-axis or Y-axis direction, for instance, in the Y-axis direction, as indicated in FIG. 19. In the embodiment of FIG. 19, an angle Δθ1 of the imaging area 276 with respect to a straight line 342 passing apexes 338, 340 of the sensed portions 334, 336 is obtained as the angular positioning error of the imaging error 276, that is, the angular positioning error of the image-taking device 248. To this end, the two dog 332 should be positioned such that the straight line 342 passing the apexes 338, 340 of the two sensed portions 334, 336 is precisely parallel to the guide rails 132 of the Y-axis slide 122 mounted on the X-axis slide 106.

Figure 20:
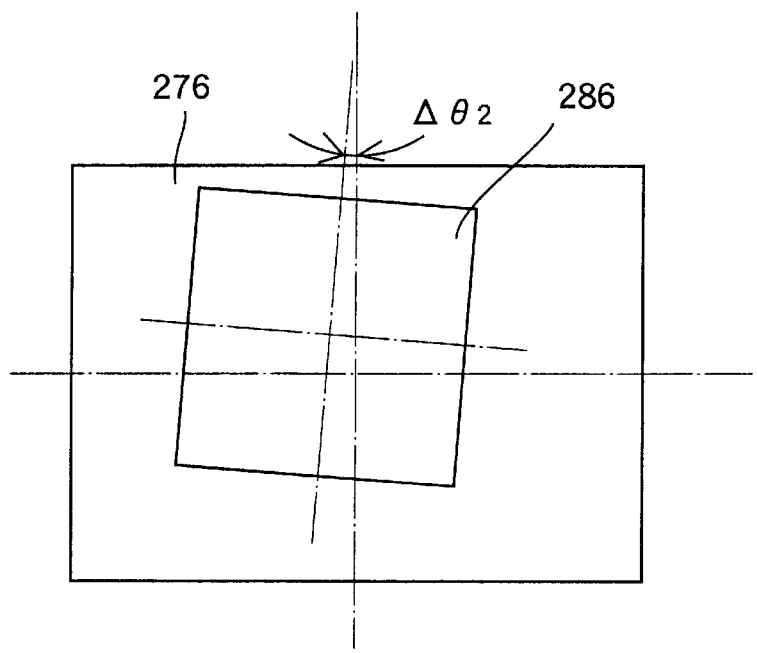
FIG. 20 is a view for explaining a manner of obtaining an angular positioning error of the fiducial mark camera in the electronic component mounting system of FIG. 19.

Further, an image of the fiducial chip 286 held by the suction nozzle 184 is taken by the image-taking device 248, as shown in FIG. 20, and an angle Δθ2 of the fiducial chip 286 with respect to the imaging area 276 is obtained. A sum of the angles Δθ1 and Δθ2 represents the angular positioning error of the fiducial chip 286.

The suction nozzle 184 is rotated to eliminate the angular positioning error of the fiducial chip 286, and the fiducial chip 286 held by the suction nozzle 184 is placed on the mounting surface 282. In this state, an image of the fiducial mark 286 is taken by the fiducial mark camera 240. An angle of the fiducial mark 286 with respect to the imaging area of the fiducial mark camera 240 is obtained. This angle represents an angular positioning error of the fiducial mark camera 240 with respect to the image-taking device 248. A sum of this angular positioning error of the fiducial mark camera 240 and the angular positioning error of the image-taking device 248 represents an absolute angular positioning error of the fiducial mark camera 240 in the XY coordinate system defined by the guide rails 30, 32 of the X-axis slide 106 and the guide rails 132 of the Y-axis slide 122. In the present second embodiment of FIGS. 19 and 20, a portion of the control device 300 assigned to detect the angular positioning error of the imaging area 276 of the image-taking device 248 on the basis of the images of the two dogs 332 constitutes an angular-position obtaining portion operable to obtain the angular positioning error of the imaging area 276.

Figure 21:
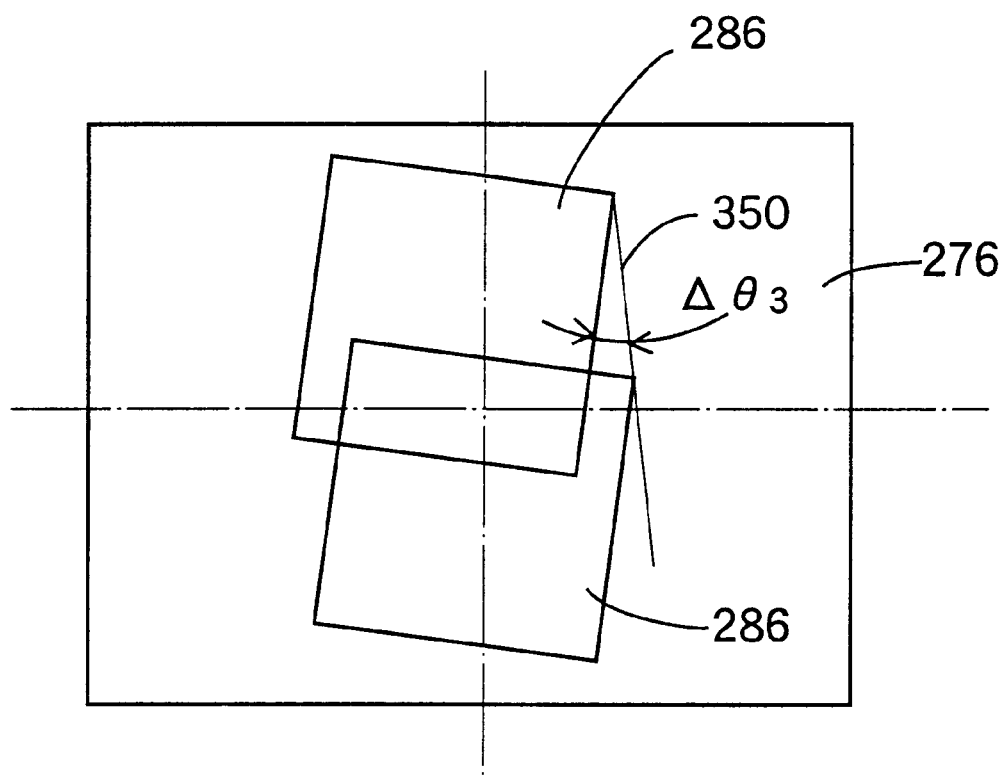
FIG. 21 is a view for explaining a manner of detecting inclination of a plurality of dogs provided in an electronic-component mounting system according to a further embodiment of this invention.

In the second embodiment of FIGS. 19–20, the two dogs 332 are positioned such that the straight line 342 passing the apexes 338, 340 of the sensed portions 334, 336 of the dogs 332 is precisely parallel to the guide rails 132 of the Y-axis slide 122. However, the electronic-component mounting system may be arranged to detect the angle of inclination of the straight line 342 passing the apexes 338, 340. For example, the angular positioning error Δθ1 and Δθ2 of the fiducial chip 286 with respect to the straight line 342 is obtained in the manner as described above, and the suction nozzle 184 is rotated so as to eliminate this angular positioning error, before the fiducial chip 286 is placed on the mounting surface 282. Then, an image of the fiducial chip 286 on the mounting surface 282 is taken by the fiducial mark camera 240. After the fiducial mark camera 240 is moved by a predetermined small distance in the X-axis or Y-axis direction, an image of the fiducial chip 286 is again taken by the fiducial mark camera 240. The two images of the fiducial chip 286 thus taken are superimposed on each other, as indicated in FIG. 21. Since a straight line 350 passing the corresponding corners of the rectangular images of the fiducial chip 286 is theoretically parallel to the Y-axis, and since the angular positioning error of the fiducial chip 286 with respect to the straight line 342 passing the apexes 338, 340 of the sensed portions 334, 336 has been eliminated by rotation of the suction nozzle 184 as described above, an angle Δθ3 of the fiducial chip 286 with respect to the straight line 350 is considered to represent an angular positioning error of the straight line 342 (passing the apexes 338, 340) with respect to the Y-axis.

Thus, the angular positioning error of the straight line 342 (passing the apexes 338, 340 of the sensed portions 334, 336 with respect to the Y-axis can be obtained, so that the absolute angular positioning errors of the image-taking device 248 and fiducial mark camera 240 can be obtained by compensating the angular positioning errors of the image-taking device 248 and the fiducial mark camera 240 with respect to the straight line 342, for the obtained angular positioning error of the straight line 342.

Figure 22:
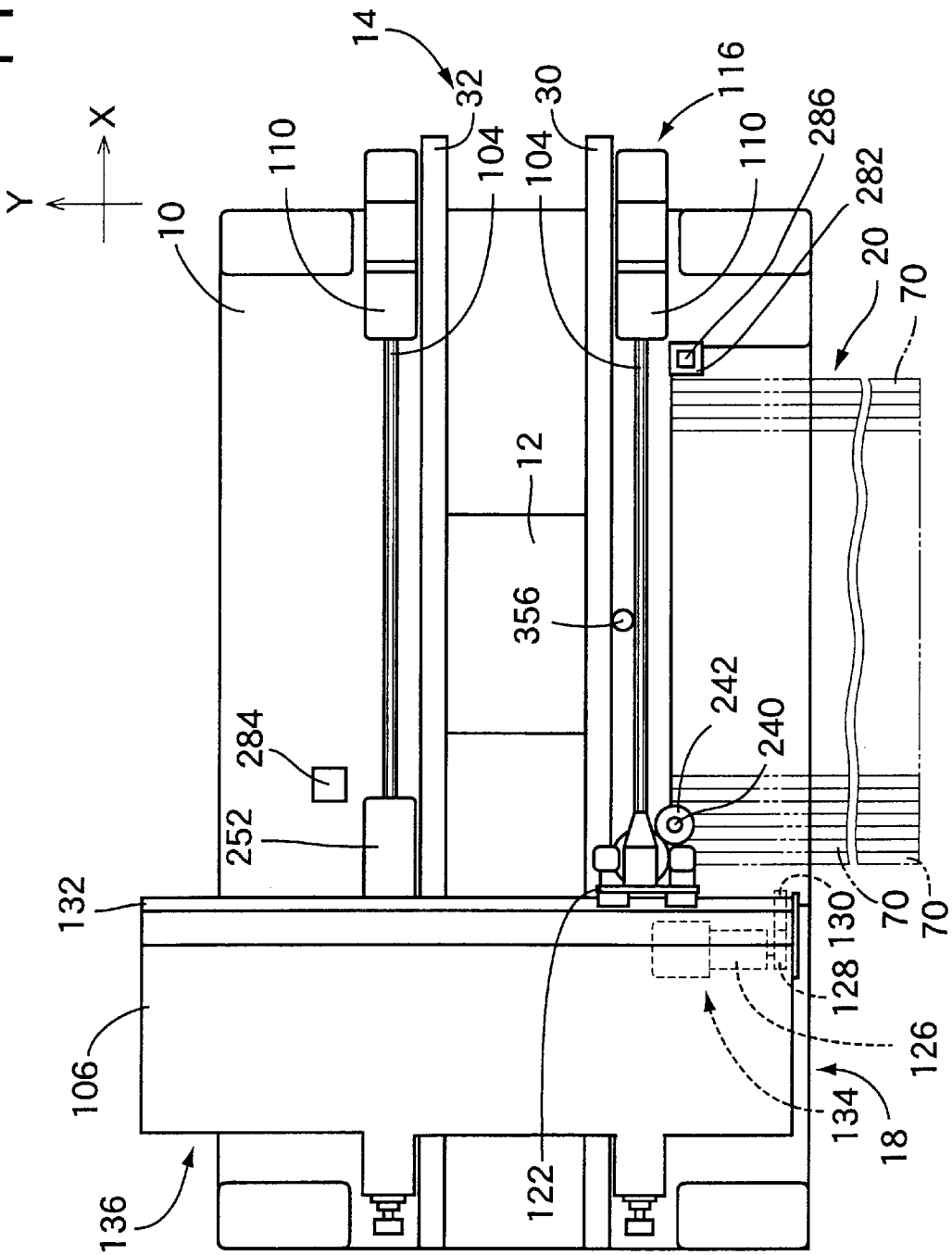
FIG. 22 is a plan view showing an electronic-component mounting system according to a still further embodiment of this invention.

The principle of the present invention is equally applicable to an electronic-component mounting system of a type shown in FIG. 22. The electronic-component mounting system of the embodiment of FIG. 22 is different from that of the first embodiment in that a component camera 356 of an image-taking device for obtaining the positioning error of the electronic component with respect to the axis of rotation of the suction nozzle is fixedly disposed on the machine base 10. Described more specifically, the component camera 356 is fixedly disposed on the machine base 10, at a position between the component supply device 20 and the PWB conveyor 14 as viewed in the Y-axis direction, and at an almost intermediate position of the printed-wiring board 12 supported by the support device 26, as viewed in the X-axis direction in which the board 12 is fed by the PWB conveyor 14. The suction nozzle 184 and the fiducial mark camera 240 are fixed on the Y-axis slide 122, as in the electronic-component mounting system of FIGS. 1 and 2. In the present electronic-component mounting system of FIG. 22, too, the relative positions (including the center position error and angular positioning error) of the suction nozzle 184, fiducial mark camera 240 and component camera 356 can be obtained on the basis of the images of a dog and fiducial chip which are similar to the dog 266 and fiducial chip 286 used in the first embodiment.

Figure 23:
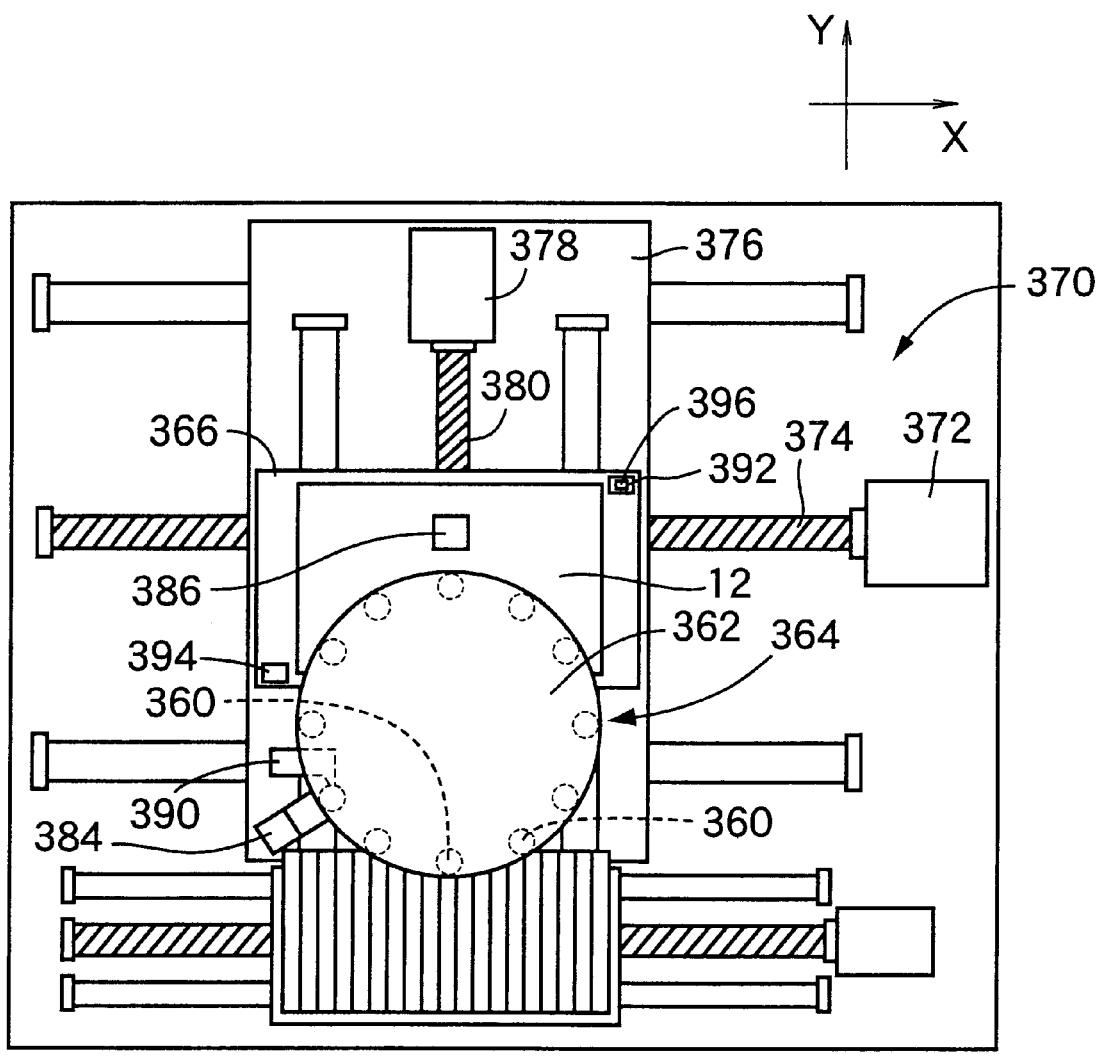
FIG. 23 is a plan view showing an electronic-component mounting system according to a yet further embodiment of this invention.

The principle of the present invention is also applicable to an electronic-component mounting system of a type shown in FIG. 23, which includes a multiplicity of component holders 360 which have respective suction nozzles and which are fixedly disposed on one index table 362. The component holders 360 are turned about the axis of rotation of the index table 362 when the index table 362 is intermittently rotated at a predetermined angular interval. The present system further includes an angular positioning device 364 for rotating the index table 362 at a plurality of predetermined working stations which are arranged on a circular path of movement of the component holders 360, so that the suction nozzle 184 held by each component holder 360 can be turned about a turning axis (axis of the index table 362) and stopped at the working stations. The system further includes a PWB support device 366 for supporting the printed-wiring board 12, and an XY positioning device 370 for positioning the PWB support device 366 in the X-axis and Y-axis directions in the XY plane parallel to the surface of the printed-wiring board 12. The XY positioning device 370 includes an X-axis slide 376 movable by an X-axis drive motor 372 and a ballscrew 374, and a Y-axis slide which is movable on the X-axis slide 376 by a Y-axis drive motor 378 and a ballscrew 380. The PWB support device 366 is mounted on the Y-axis slide. An image-taking device 384 which includes a component camera and a waveguide device and which is operable to take an image of the electronic component 82 is fixedly disposed at a position at which the component camera is opposed to the end face of the suction nozzle of the component holder 360 located at one of the above-indicated working stations. A first rotating device (not shown) is fixedly disposed above the image-taking device 380 and the corresponding component holder 360, for rotating this component holder 360. A second rotating device (not shown) is fixedly disposed at the working station between the working station at which the image-taking device 384 is disposed, and the working station at which the electronic component 82 is mounted on the printed-wiring board 12. The second rotating device is provided to rotate the component holder 360 to eliminate an angular positioning error of the electronic component 82. A Z-axis drive device (not shown) is provided to lift and lower the suction nozzle for holding the electronic component 82 and for mounting the electronic component 82 on the board 12. A fiducial mark camera 386 is fixedly disposed for taking an image of a fiducial mark provided on the printed-wiring board 12 supported on the PWB support device 366. In the interest of simplicity, FIG. 23 does not show support structures for supporting the index table 362, image-taking device 384, fiducial mark camera 386, and a dog 390. The index table 362 may be replaced by a plurality of rotary members which are rotated about a common axis of rotation by a cam device, at a controlled rotating velocity, so that the rotary members are stopped at a plurality of working stations at different times. For instance, the rotary members hold respective component holders 360 such that the component holder 360 held by each rotary member is rotatable and axially movable relative to the rotary member.

In the electronic-component mounting system of FIG. 23, the dog 390 is fixedly disposed near the working station at which the image-taking device 384 is disposed. The dog 390 is positioned relative to the above-indicated working state, so that an image of the dog 390 is taken by the image-taking device 384, together with an image of the electronic component held by the suction nozzle of the component holder 360 at the above-indicated working station. The present system is also provided with first and second mounting surfaces 392, 394 on which a fiducial chip 396 is placed. In substantially the same manner as in the first embodiment, the rotation axis of each component holder 360, that is, the position of the rotation axis of the suction nozzle is estimated on the basis of an image of the dog 390, and the positioning error of the electronic component 82 with respect to the thus estimated position of the rotation axis of the suction nozzle. Further, the positions of the rotation axis of the suction nozzle and the fiducial mark camera 386 relative to the image-taking device 386, and the operating error of the XY positioning device 370 can be obtained as in the first embodiment.

In the illustrated embodiments, the first image-taking device 248, 356, 384 and the second image-taking devices in the form of the fiducial mark camera 240, 386 are arranged to take a two-dimensional image at one time. However, any of these first and second image-taking devices may be replaced by a line-sensor type imaging device using a straight array of multiple imaging elements which is intermittently moved relative to an object by a predetermined pitch to obtain multiple lines of image which collectively form a two-dimensional image. Where the first image-taking device is replaced by a line-sensor type imaging device, the line-sensor type imaging device may be constructed such that a straight array of multiple imaging elements is disposed so as to extend in a first direction parallel to the top surface of the electronic component. In this case, the straight array of imaging elements is intermittently moved in a second direction which is parallel to the top surface of the electronic component and which perpendicular to the first direction (line of extension of the straight array).

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An apparatus for detecting a positioning error of an electric component with respect to a suction nozzle by which the electric component is held by suction under a negative pressure, comprising:

an image-taking device operable to take an image of said suction nozzle in a direction of extension of a centerline of said suction nozzle;

at least one dog, disposed at a position at which an image of said at least one dog can be taken together with the image of said suction nozzle by said image-taking device; and a control device including an image-taking control device electrically connected to said image-taking device, and a data processing device electrically connected to said image-taking control device, wherein said image-taking control device is operable to operate said image-taking device to concurrently take said images of said suction nozzle and said at least one dog, and to concurrently take an image of said electric component as held by said suction nozzle and said image of said at least one dog, and said data processing device being operable to obtain a relative position between said suction nozzle and said at least one dog, on the basis of said images of said suction nozzle and said at least one dog which have been concurrently taken, and obtaining said positioning error of said electric component with respect to said suction nozzle, on the basis of said images of said electric component and said at least one dog which have been concurrently taken, and said relative position between said suction nozzle and said at least one dog.

2. The apparatus according to claim 1, wherein said image-taking control device comprises a plural-imaging control portion operable to rotate said suction nozzle at least once and take images of an end face of said suction nozzle placed in at least two angular positions thereof, and a rotation-axis obtaining portion operable to obtain an axis of rotation of said suction nozzle on the basis of the images of said end face of said suction nozzle in said at least two angular positions.

3. The apparatus according to claim 1, wherein said at least one dog comprises of a plurality of dogs which are located such that images of said plurality of dogs are formed at respective peripheral portions of an imaging area of said image-taking device, when said images of said dogs are taken by said image-taking device, concurrently with the image of said suction nozzle.

4. The apparatus according to claim 3, wherein said data processing device obtains an inclination of said imaging area of said image-taking device on the basis of the images of said plurality of dogs.

5. The apparatus according to claim 1, wherein each of said at least one dog includes a sensed portion having a generally rectangular shape and an apex which is defined by adjacent two sides of a rectangle of said generally rectangular shape.

6. The apparatus according to claim 5, wherein said sensed portion has two chamfered surfaces formed along said adjacent two sides, so as to provide two sharp edges of an acute angle which intersect each other at right angles at said apex.

* * * * *